(12) United States Patent
Akou et al.

(10) Patent No.: US 9,576,881 B2
(45) Date of Patent: Feb. 21, 2017

(54) SEMICONDUCTOR DEVICE

(71) Applicant: KABUSHIKI KAISHA TOSHIBA, Minato-ku (JP)

(72) Inventors: Masayuki Akou, Yokohama (JP); Norihisa Arai, Saitama (JP); Keisuke Murayama, Chigasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/724,217

(22) Filed: May 28, 2015

(65) Prior Publication Data

US 2015/0262914 A1 Sep. 17, 2015

Related U.S. Application Data

(63) Continuation-in-part of application No. 14/017,454, filed on Sep. 4, 2013, now Pat. No. 9,147,641.

(30) Foreign Application Priority Data

Feb. 18, 2013 (JP) ................................. 2013-029415

(51) Int. Cl.
  *H01L 23/48* (2006.01)
  *H01L 23/528* (2006.01)
  (Continued)

(52) U.S. Cl.
  CPC ....... *H01L 23/481* (2013.01); *H01L 21/76898* (2013.01); *H01L 21/743* (2013.01); *H01L 2224/11* (2013.01); *H01L 2924/0002* (2013.01)

(58) Field of Classification Search
  CPC ........ H01L 29/00; H01L 29/167; H01L 23/48; H01L 23/481; H01L 23/522; H01L 23/528; H01L 23/5226; H01L 2924/01078; H01L 2924/01079; H01L 2924/01029
  (Continued)

(56) References Cited

U.S. PATENT DOCUMENTS 8,907,493 B2    12/2014  Uchida et al.
8,921,224 B2    12/2014  Watanabe
(Continued)

FOREIGN PATENT DOCUMENTS

JP    2002-237468        8/2002
JP    2008-226882 A      9/2008
(Continued)

OTHER PUBLICATIONS

Office Action issued May 8, 2015 in Japanese Patent Application No. 2013-029415 (with English language translation).

*Primary Examiner* — Chuong A Luu
(74) *Attorney, Agent, or Firm* — Oblon, McClelland, Maier & Neustadt, L.L.P.

(57) ABSTRACT

According to one embodiment, a semiconductor device includes: a semiconductor substrate, the semiconductor substrate having first and second surfaces; conductive regions extending in a direction from the first surface side toward the second surface side of the semiconductor substrate, the conductive regions including first and second vias; a first semiconductor region surrounding a part of each of the conductive regions on the second surface side of the semiconductor substrate, a portion other than a front surface of the first semiconductor region being surrounded by the semiconductor substrate; a first electrode provided on the second surface side; second electrodes provided on the first surface side, one of the second electrodes being in contact with one of the conductive regions; and an insulating film provided between each of the conductive regions and the semiconductor substrate, and between each of the conductive regions and the first semiconductor region.

19 Claims, 14 Drawing Sheets

(51) Int. Cl.
*H01L 21/768* (2006.01)
*H01L 21/74* (2006.01)

(58) Field of Classification Search
USPC .................. 257/774, 334, 337, 713, 776
See application file for complete search history.

(56) References Cited

U.S. PATENT DOCUMENTS

| | | | |
|---|---|---|---|
| 9,147,641 B2* | 9/2015 | Arai | H01L 23/481 |
| 2008/0054313 A1* | 3/2008 | Dyer | G03F 9/7084 |
| | | | 257/276 |
| 2008/0087952 A1* | 4/2008 | Pfirsch | H01L 29/7825 |
| | | | 257/334 |
| 2010/0237386 A1 | 9/2010 | Lin et al. | |
| 2012/0289003 A1 | 11/2012 | Hirler et al. | |
| 2012/0292784 A1 | 11/2012 | Nishio | |
| 2012/0315758 A1 | 12/2012 | Sakurai et al. | |
| 2013/0026536 A1 | 1/2013 | Corona et al. | |

FOREIGN PATENT DOCUMENTS

| | | |
|---|---|---|
| JP | 2009-88336 A | 4/2009 |
| JP | 2011-176003 | 9/2011 |
| JP | 2011-176100 | 9/2011 |
| WO | WO 2005/086216 A1 | 9/2005 |

* cited by examiner

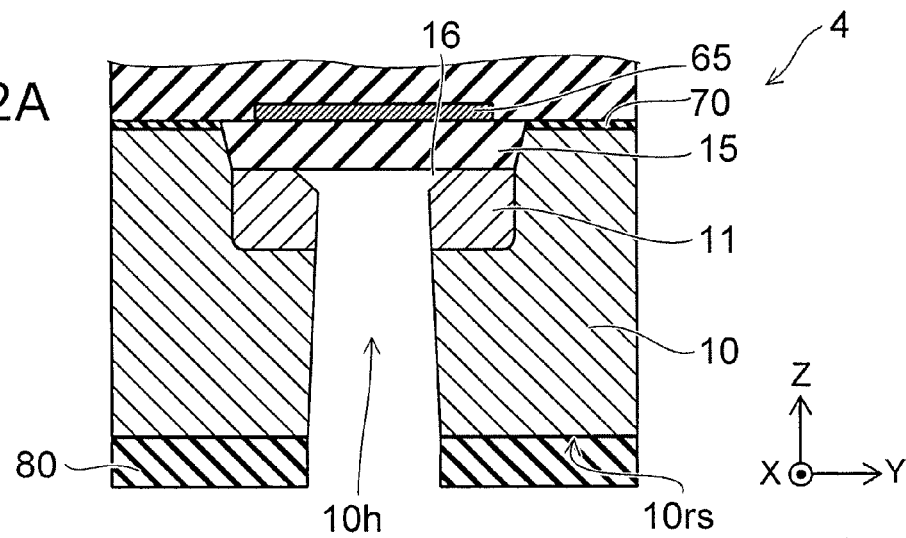
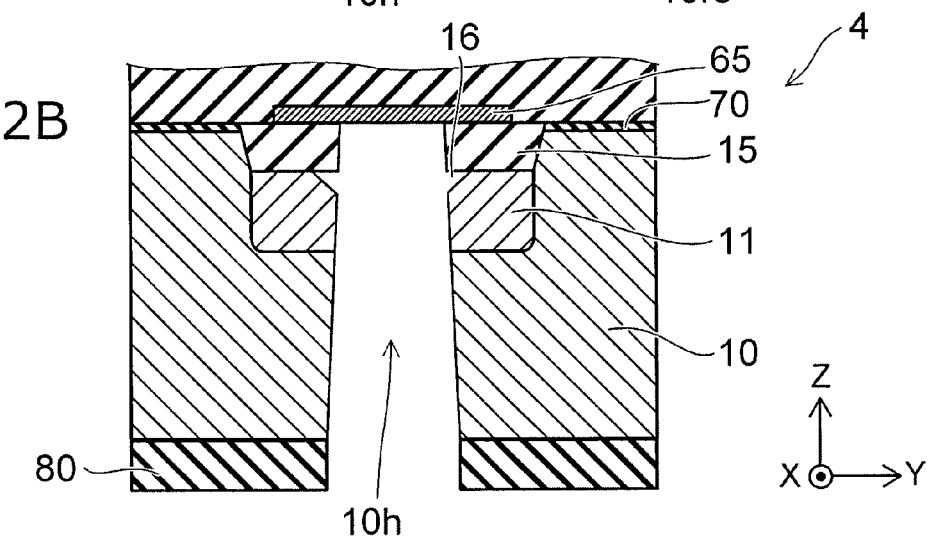
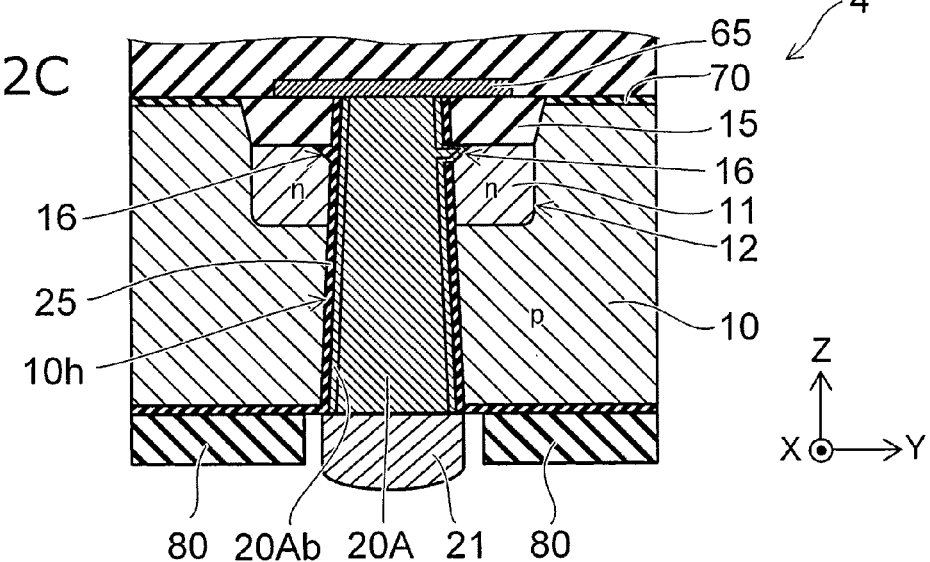

SEMICONDUCTOR DEVICE

CROSS-REFERENCE TO RELATED APPLICATIONS

This application is a Continuization-in-part of U.S. patent application Ser. No. 14/017,454, filed Sep. 4, 2013 now U.S. Pat. No. 9,147,641, and is based upon and claims the benefit of priority from Japanese Patent Application No. 2013-029415, filed Feb. 18, 2013; the entire contents of which are incorporated herein by reference.

FIELD

Embodiments described herein relate generally to a semiconductor device.

BACKGROUND

A through via (through silicon via, TSV) is introduced as a technology whereby a plurality of semiconductor chips can be mounded at high density. In the case where the semiconductor is silicon (Si), the through via is a conductive region piercing from the back surface to the front surface of the silicon substrate, for example. A plurality of semiconductor chips are electrically connected via the respective through vias to mount the plurality of semiconductor chips at high density; thereby, high-speed data transfer is enabled.

However, since a via hole for providing the through via is formed deep in a semiconductor substrate, the aspect ratio becomes higher and the etching processing thereof becomes more difficult as the miniaturization of semiconductor devices progresses. Consequently, the reliability of semiconductor devices including the through via may be reduced.

For example, until now, for an electrode to be electrically connected to a through via, there has been a case where a faulty connection (open) between an interconnection layer existing between the through via and the electrode and the through via occurs, and as a result a faulty connection between the through via and the electrode occurs. To deal with this, a plurality of through vias have been provided to connect one of the plurality of through vias and the interconnection layer; thereby, a faulty connection has been prevented.

However, since a via hole for providing the through via is formed deep in a semiconductor substrate, the aspect ratio becomes higher and the etching processing thereof becomes more difficult as the miniaturization of semiconductor devices progresses. Consequently, an operational malfunction, a faulty operation, and a yield reduction of semiconductor devices including the through via may be caused.

BRIEF DESCRIPTION OF THE DRAWINGS

FIG. 12A to FIG. 12C are schematic cross-sectional views showing one example of effects of the semiconductor device according to the fourth embodiment;

DETAILED DESCRIPTION

Figure 1A:
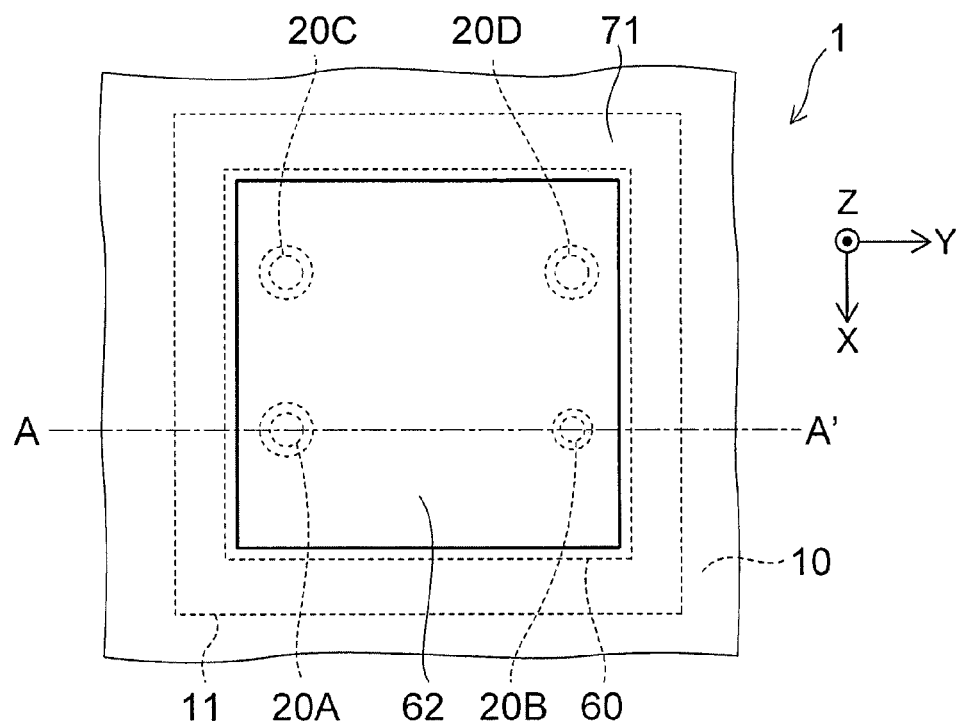
FIG. 1A is a schematic plan view showing a semiconductor device according to a first embodiment.

In general, according to one embodiment, a semiconductor device includes: a semiconductor substrate of a first conductivity type, the semiconductor substrate having a first surface and a second surface on an opposite side to the first surface; a plurality of conductive regions extending in a direction from a side of the first surface toward a side of the second surface of the semiconductor substrate, the conductive regions including a first via and a second via; a first semiconductor region of a second conductivity type surrounding a part of each of the conductive regions on the side of the second surface of the semiconductor substrate, a portion other than a front surface of the first semiconductor region being surrounded by the semiconductor substrate; a first electrode provided on the side of the second surface of the semiconductor substrate; a plurality of second electrodes provided on the side of the first surface of the semiconductor substrate, one of the second electrodes being in contact with one of the conductive regions; and an insulating film provided between each of the conductive regions and the semiconductor substrate, and provided between each of the conductive regions and the first semiconductor region. The first via pierces the semiconductor substrate and the first semiconductor region and is in contact with the first electrode. The second via stops in the first semiconductor region.

Hereinbelow, embodiments are described with reference to the drawings. In the following description, identical components are marked with the same reference numerals, and a description of components once described is omitted as appropriate.

First Embodiment

Figure 1B:
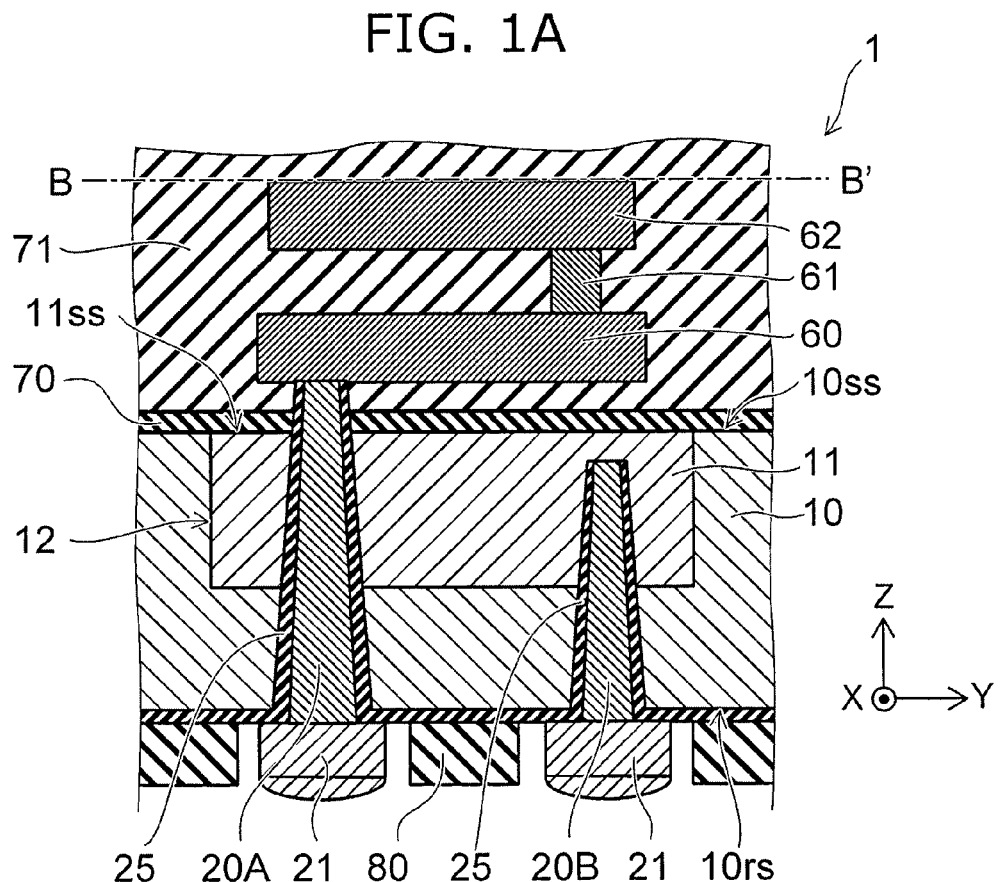
FIG. 1B is a schematic cross-sectional view showing the semiconductor device according to the first embodiment.

FIG. 1A is a schematic plan view showing a semiconductor device according to a first embodiment, and FIG. 1B is a schematic cross-sectional view showing the semiconductor device according to the first embodiment.

FIG. 1A shows a cross section taken along line B-B' of FIG. 1B, and FIG. 1B shows a cross section taken along line A-A' of FIG. 1A.

A semiconductor device 1 includes a semiconductor layer (semiconductor substrate) 10, an electrode 60, a plurality of conductive regions 20A to 20D, a semiconductor region 11 (a first semiconductor region), and an insulating film 25. The semiconductor device 1 is part of a multi-chip package semiconductor device, for example.

The semiconductor layer 10 is a p-type (first conductivity type) semiconductor layer, for example. The semiconductor layer 10 has a back surface 10$rs$ (a first surface) and a front surface 10$ss$ (a second surface) on the opposite side to the back surface 10$rs$. The semiconductor layer 10 is a semiconductor substrate fashioned in a thin film form. A semiconductor substrate is made into a thin film form by grinding the back surface side of the semiconductor substrate, for example (described later). The electrode 60 is provided on the front surface 10$ss$ side of the semiconductor layer 10.

The plurality of conductive regions 20A to 20D extend in the direction from the back surface 10$rs$ side toward the front surface 10$ss$ side of the semiconductor layer 10. One of the conductive regions 20A to 20D is a through via (TSV). The plurality of conductive regions 20A to 20D include the conductive region 20A in contact with the electrode 60 (a first via) and the conductive region 20B in contact with the semiconductor region 11 and not in contact with the electrode 60 (a second via), for example. In other words, the conductive region 20B stops partway through the semiconductor region 11. Each of the conductive regions 20C and 20D is in contact with the electrode 60. Each of the conductive regions 20A to 20D is connected to an electrode 21. The electrode 21 is exposed from the semiconductor layer 10. The plurality of electrodes 21 are provided on a side of a back surface 10$rs$ of the semiconductor layer 10. One of the plurality of electrodes 21 is in contact with one of the plurality of conductive regions 20A to 20D.

The number of conductive regions 20A to 20D is an example and is not limited thereto. At least one conductive region may be provided between the back surface 10$rs$ and the front surface 10$ss$ of the semiconductor layer 10, for example. The conductive region in contact with the electrode 60 and the conductive region not in contact with the electrode 60 are an example. The number of conductive regions in contact with the electrode 60 and the number of conductive regions not in contact with the electrode 60 are not limited to the numbers illustrated.

The semiconductor region 11 is an n-type (second conductivity type) semiconductor region, for example. The semiconductor region 11 surrounds part (for example, an upper portion) of each of the plurality of conductive regions 20A to 20D on the front surface 10$ss$ side of the semiconductor layer 10. Portions other than the front surface 11$ss$ of the semiconductor region 11 (for example, a lower portion and a side portion of the semiconductor region 11) are surrounded by the semiconductor layer 10. By the semiconductor region 11 and the semiconductor layer 10 being in contact, a pn junction 12 is formed in the semiconductor layer 10. The semiconductor region 11 may be referred to as a well region.

The insulating film 25 is provided between each of the plurality of conductive regions 20A to 20D and the semiconductor layer 10 and between each of the plurality of conductive regions 20A to 20D and the semiconductor region 11. The insulating film 25 is further provided under the back surface 10$rs$ of the semiconductor layer 10. An insulating layer 80 is provided under the back surface 10$rs$ of the semiconductor layer 10 via the insulating film 25. The electrode 21 is exposed from the insulating layer 80.

The semiconductor device 1 further includes an insulating film 70 provided on the semiconductor layer 10 and on the semiconductor region 11. An interlayer insulating film 71 is provided on the insulating film 70. A contact 61 connected to the electrode 60 and an electrode 62 connected to the contact 61 are provided in the interlayer insulating film 71. The insulating film 70 or the interlayer insulating film 71 may be removed as necessary.

Other than these, the semiconductor device 1 includes an element, an interconnection, etc. (not shown) on the front surface 10$ss$ side of the semiconductor, layer 10. The element is an active element such as a transistor and a diode, a passive element such as a resistance and a capacitor, a memory element, or the like, for example. The planar shape of the conductive regions 20A to 20D is not limited to a circle but may be a polygon. One of the electrode 60 and the electrode 62 may be electrically connected to the element, the interconnection or the like described above.

The semiconductor layer 10 contains a silicon crystal doped with an impurity element such as boron (B), for example. The semiconductor region 11 contains a silicon crystal doped with an impurity element such as phosphorus (P) and arsenic (As), for example.

The conductive regions 20A to 20D and the electrode 21 contain at least one of copper (Cu), tungsten (W), nickel (Ni), titanium (Ti), tin (Sn), and polysilicon, for example. The conductive regions 20A to 20D and the electrode 21 may be a stacked body in which at least one of copper (Cu), tungsten (W), nickel (Ni), titanium (Ti), tin (Sn), polysilicon, and the like is stacked, for example.

The electrodes 60 and 62 and the contact 61 contain at least one of aluminum (Al), copper (Cu), tungsten (W), and polysilicon. The electrodes 60 and 62 and the contact 61 may be a stacked body in which at least one of aluminum (Al), copper (Cu), tungsten (W), polysilicon, and the like is stacked.

The insulating films 25 and 70 and the interlayer insulating film 71 contain at least one of silicon oxide ($SiO_2$), silicon nitride ($Si_3N_4$), and the like, for example. The insulating films 25 and 70 and the interlayer insulating film 71 may be a stacked body in which at least one of silicon oxide ($SiO_2$), silicon nitride ($Si_3N_4$), and the like is stacked, for example. The insulating layer 80 contains at least one of silicon oxide ($SiO_2$), silicon nitride ($Si_3N_4$), a resin, and the like, for example. Members referred to as the insulating layer and the insulating film in the embodiment include, for example, at least one of silicon oxide ($SiO_2$), silicon nitride ($Si_3N_4$), and a resin or the like.

The manufacturing process of the semiconductor device 1 will now be described.

FIG. 2A to FIG. 4B are schematic cross-sectional views showing the manufacturing process of the semiconductor device according to the first embodiment. FIG. 2A to FIG. 4B show a cross section taken along line A-A' described above, as the manufacturing process of the semiconductor device according to the first embodiment.

Figure 2A:
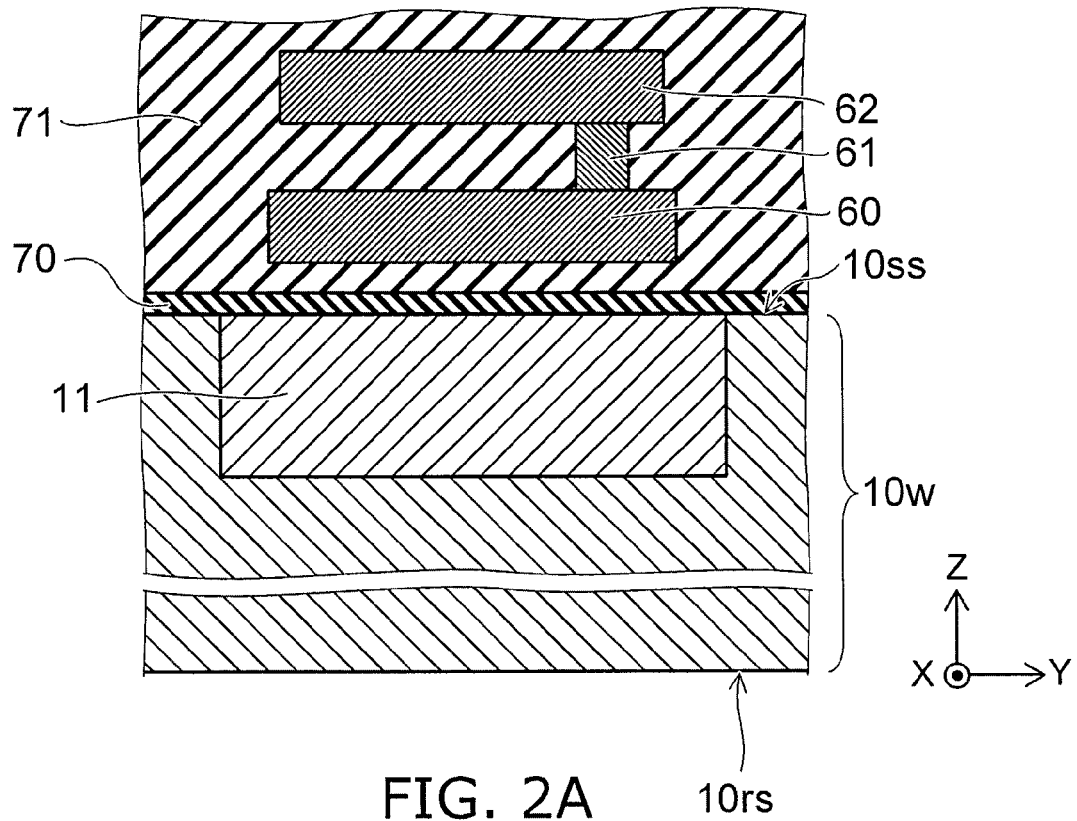
FIG. 2A to FIG. 4B are schematic cross-sectional views showing the manufacturing process of the semiconductor device according to the first embodiment.

First, as shown in FIG. 2A, on the front surface 10$ss$ side of a p-type semiconductor substrate (semiconductor wafer) 10$w$, the semiconductor region 11, the insulating film 70, the electrodes 60 and 62, the contact 61, and the interlayer insulating film 71 are formed by a wafer process. Further, an element, an interconnection, etc. are formed on the front surface 10$ss$ side of the semiconductor substrate 10$w$ by a wafer process (not shown). In the wafer process, photolithography technology, etching technology, film formation technology, grinding technology, ion implantation technology, etc. are introduced. The thickness in the Z direction of the semiconductor substrate 10w at this stage is 1 mm or less (e.g. 0.8 mm), for example. In the first embodiment, the semiconductor region 11 is formed by photolithography technology and ion implantation technology, for example.

Thus far, generally an STI (shallow trench isolation) element isolation region has been provided in the front surface 10ss of the p-type semiconductor substrate (semiconductor wafer) 10w and a through via has been formed under the element isolation region. The region where one through via is formed has thus far been a region with a large area (usually, a diameter of 50 μm or more). The STI formation is influenced by the dishing effect due to CMP processing to cause a yield reduction of semiconductor devices. In contrast, in the structure of the embodiment, the TSV formation region has no STI accompanied by the dishing effect.

Figure 2B:
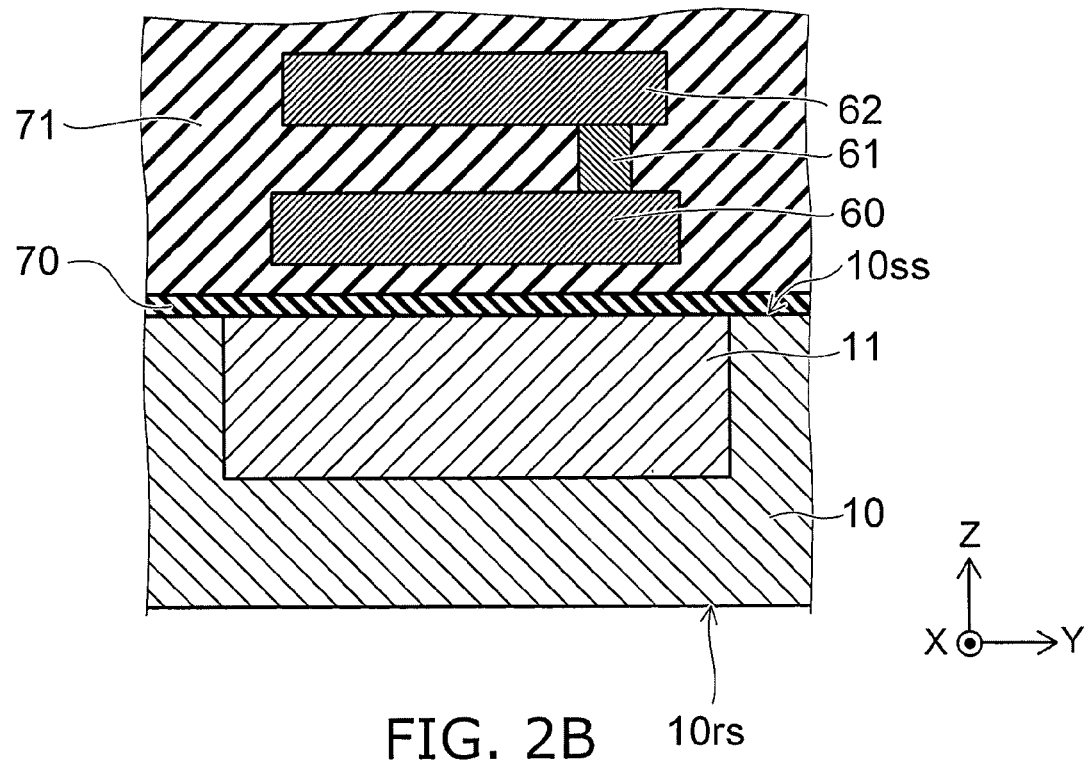

Next, as shown in FIG. 2B, the semiconductor substrate 10w is made thin to form the semiconductor layer 10. For example, the back surface 10rs of the semiconductor substrate 10w is ground by CMP (chemical mechanical polishing) to form a thin semiconductor layer 10. The thickness in the Z direction of the semiconductor layer 10 at this stage is 20 μm to 50 μm, for example.

Figure 3A:
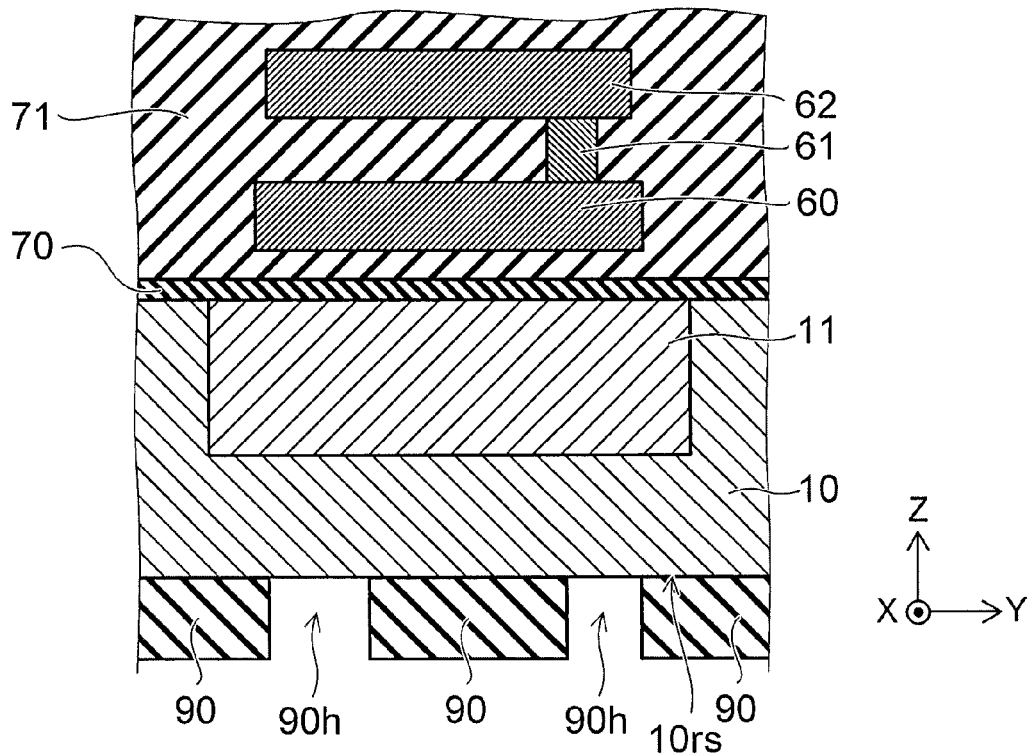

Next, as shown in FIG. 3A, a mask layer 90 is patterned on the back surface 10rs side of the semiconductor layer 10. The patterning of the mask layer 90 is performed according to photolithography, etching, etc., for example. The mask layer 90 includes an insulating layer of silicon oxide ($SiO_2$), silicon nitride ($Si_3N_4$), or the like, a resist, or the like. The positions of the openings 90h of the mask layer 90 correspond to the positions of the conductive regions 20A and 20B described above.

As described above, FIG. 3A is a cross section corresponding to the position of line A-A' of FIG. 1A. The opening 90h is actually formed also in the positions of the conductive regions 20C and 20D described above.

Figure 3B:
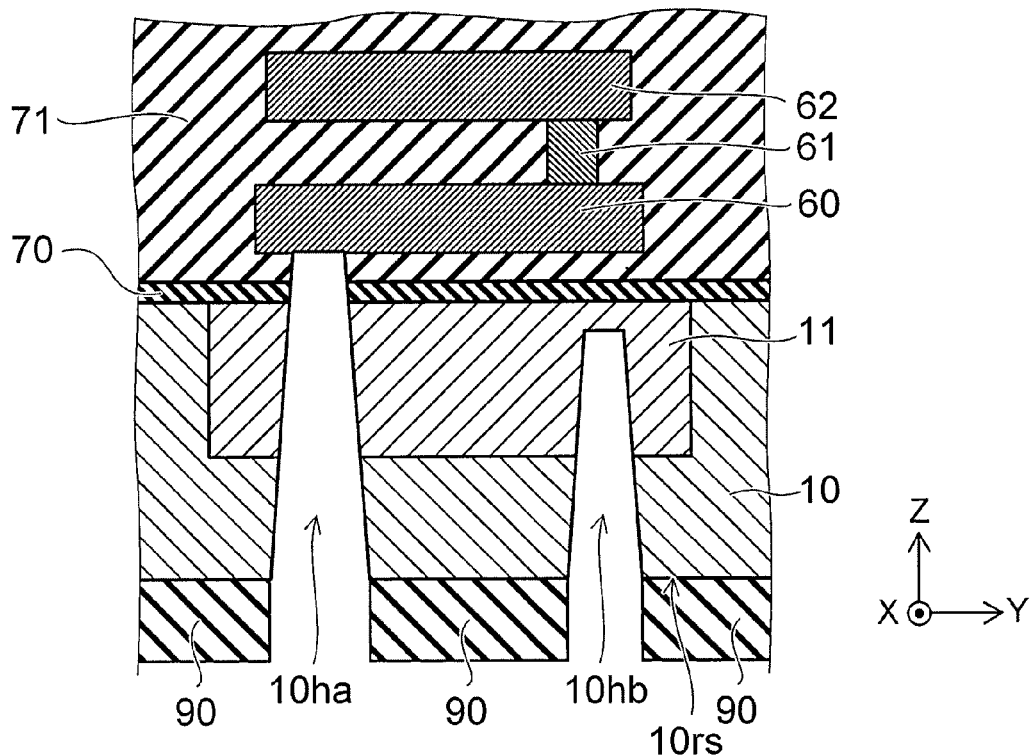

Next, as shown in FIG. 3B, etching processing is performed on the semiconductor layer 10 exposed from the mask layer 90 in the opening 90h. The etching processing is RIE (reactive ion etching), for example. Thereby, a via hole 10ha and a via hole 10hb are formed in the semiconductor layer 10, for example. A via hole is formed also in the positions of the conductive regions 20C and 20D described above. In other words, four via holes are formed at the stage of FIG. 3B. A width in the Y-direction (or the X-direction) of the via hole is 5 μm to 50 μm.

To miniaturize the semiconductor device, it is preferable to form the via hole with as high an aspect ratio as possible. However, as the aspect ratio of the via hole increases, dry etching processing becomes more difficult. Hence, a phenomenon may occur in which one of the plurality of via holes etched from the back surface 10rs of the semiconductor layer 10 does not reach the front surface 10ss. For example, FIG. 3B shows a state where the via hole 10hb does not reach the front surface 10ss of the semiconductor layer 10 and the end of the via hole 10hb stops partway through the semiconductor region 11.

Figure 4A:
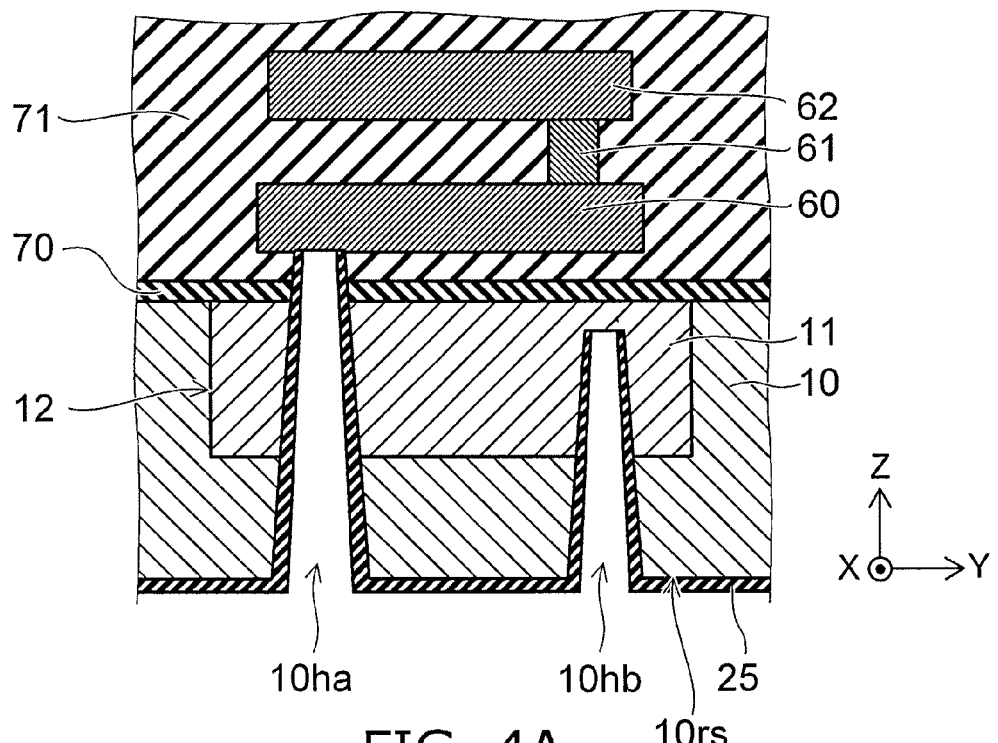

Next, as shown in FIG. 4A, the insulating film 25 is formed on the inner walls of the via holes 10ha and 10hb and on the back surface 10rs side of the semiconductor layer 10 by, for example, CVD (Chemical Vapor Deposition).

Figure 4B:
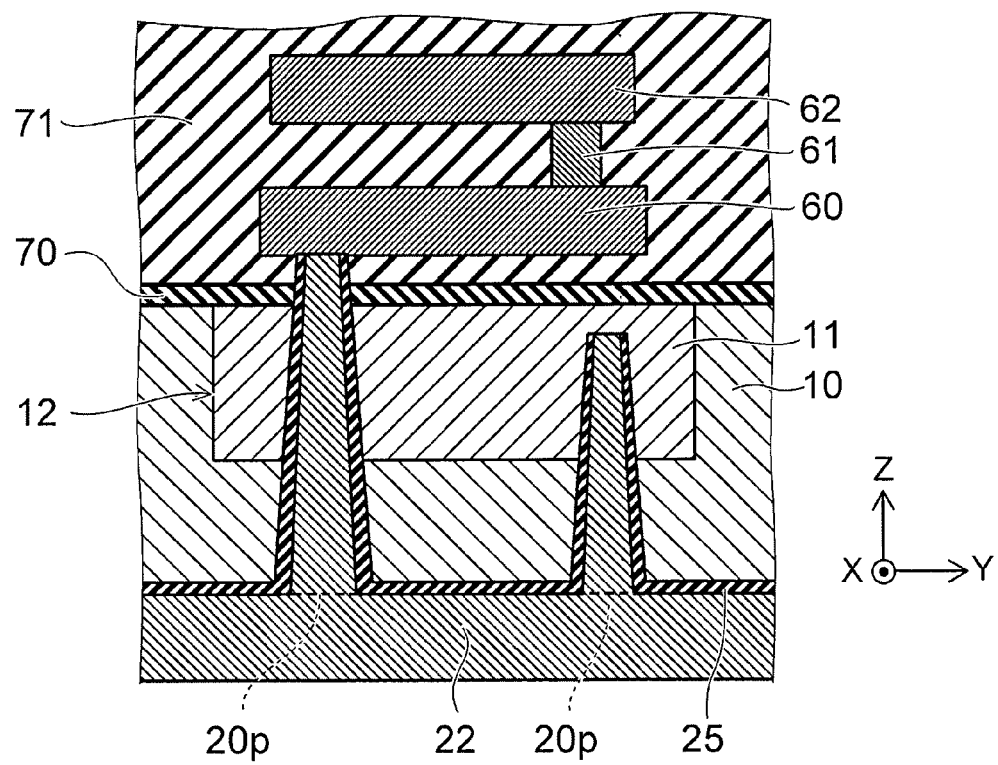

Next, as shown in FIG. 4B, a conductive region 22 is formed on the inner walls of the via holes 10ha and 10hb and on the back surface 10rs side of the semiconductor layer 10 via the insulating film 25. The components of the conductive region 22 are the same as those of the conductive regions 20A to 20D or the electrode 21. The conductive region 22 is, for example formed by a method of plating or sputtering.

After that, the conductive region 22 is processed into the conductive regions 20A and 20B (see FIG. 1B). Also, the conductive regions 20C and 20D are formed. After that, dicing processing is performed on the semiconductor layer 10 to fragment the semiconductor layer 10.

In the first embodiment, even when the via hole 10hb not piercing exists during the manufacturing process, one of the other via holes pierces from the back surface 10rs to the front surface 10ss of the semiconductor layer 10. Thus, a through via functioning normally is certainly provided in the semiconductor device 1. Therefore, in the semiconductor device 1, a malfunction in which the through via and the electrode 60 experience an open fault does not occur. In other words, even when there is a variation in the depth of the via hole, an open fault of the through via and the electrode 60 is prevented by forming a plurality of via holes and making one of the via holes reach the electrode 60.

The conductive region 20B provided in the not-piercing via hole 10hb is used as an unused electrode, for example. Alternatively, the conductive region 20B may be used for uses other than the through via. The semiconductor device 1 has a structure in which reliability is not reduced even when the conductive region 20B not reaching the electrode 60 is formed (described later).

The operation and effect of the semiconductor device 1 according to the first embodiment will now be described.

Figure 5:
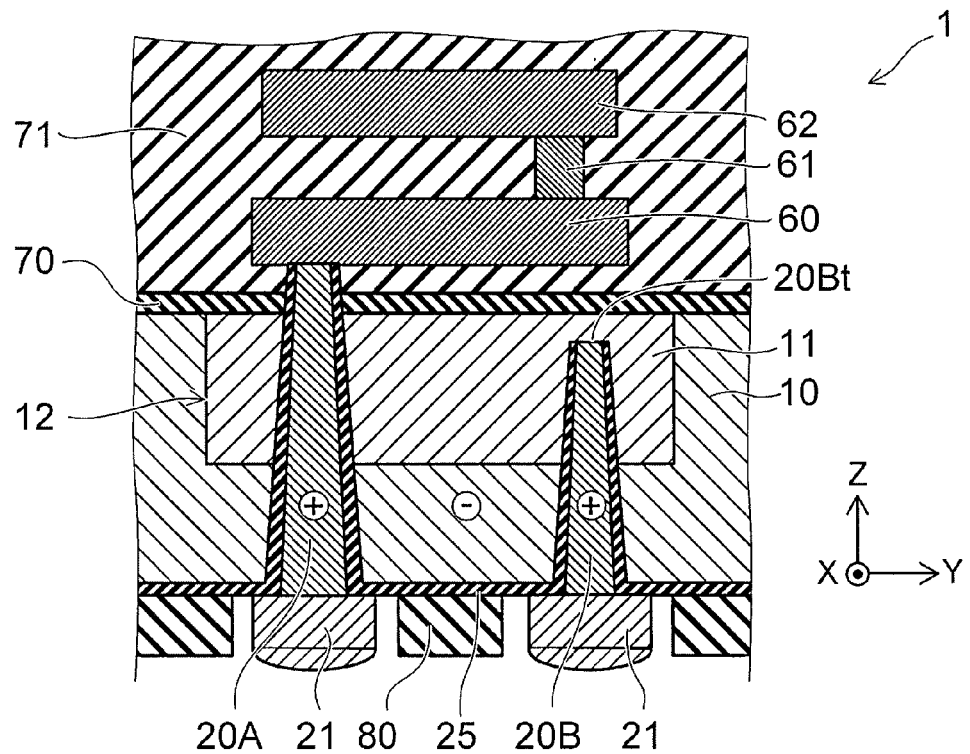
FIG. 5 is a schematic cross-sectional view showing the operation and effect of the semiconductor device according to the first embodiment.

FIG. 5 is a schematic cross-sectional view showing the operation and effect of the semiconductor device according to the first embodiment.

In the semiconductor device 1, in general, the electric potential of the semiconductor layer 10, which is a base substance, is kept at the ground potential, and a positive potential is applied to the conductive regions 20A and 20B to drive the element.

Here, the conductive region 20A is connected to the electrode 60. Therefore, the electric potential (e.g. a positive potential) applied to the conductive region 20A is normally conducted to the electrode 60. The conductive region 20A is insulated from the semiconductor layer 10 and the semiconductor region 11 by the insulating film 25. Therefore, the portions between the conductive region 20A and the semiconductor layer 10 and between the conductive region 20A and the semiconductor region 11 are in a structure through which a leak current does not flow.

On the other hand, the tip 20Bt of the conductive region 20B does not reach the electrode 60. The tip 20Bt of the conductive region 20B is in contact with the semiconductor region 11. The insulating film 25 is not provided between the tip 20Bt of the conductive region 20B and the semiconductor region 11. Therefore, when, for example, a positive potential is applied to the conductive region 20B and the ground potential (or a negative potential) is applied to the semiconductor layer 10, carriers in the conductive region 20B may flow into the semiconductor region 11. In the drawing, a minus sign is shown in the semiconductor layer 10 as an example.

However, the semiconductor layer 10 is a p-type layer and the semiconductor region 11 is an n-type layer. Hence, the pn junction 12 is in a state where a reverse bias is applied whereby the p-type layer side becomes a negative electrode and the n-type layer side becomes a positive electrode. Thereby, the energy barrier in the pn junction 12 becomes larger, and carrier diffusion from the conductive region 20B to the semiconductor layer 10 is suppressed. In other words, the semiconductor device 1 has a structure in which a current leak is less likely to occur between the conductive region 20B and the semiconductor layer 10 even when the conductive region 20B stops partway through the semiconductor region 11. Therefore, the electric potential of the semiconductor layer 10 is stabilized, and an element provided on the front surface 10ss side of the semiconductor layer 10 is driven stably. Thus, in the semiconductor device 1, there is no operational malfunction, and a faulty operation and a yield reduction are less likely to occur.

Figure 6:
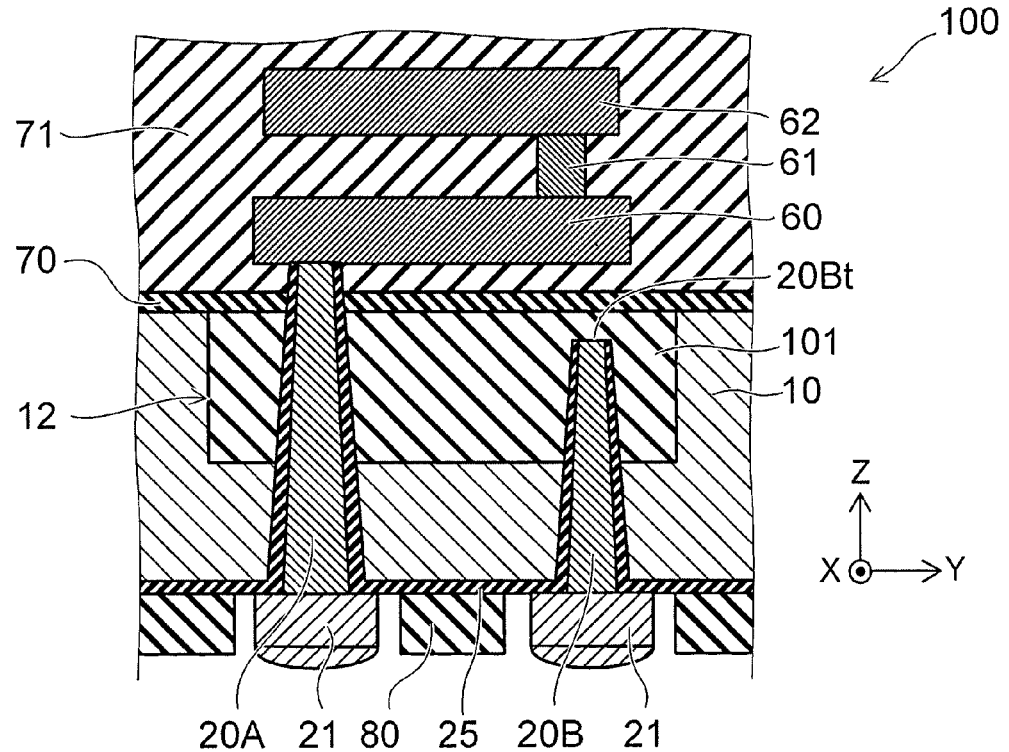
FIG. 6 is a schematic cross-sectional view of a semiconductor device according to a reference example.

FIG. 6 is a schematic cross-sectional view of a semiconductor device according to a reference example.

FIG. 6 shows a semiconductor device 100 in which the semiconductor region 11 is replaced with an insulating layer 101. In the semiconductor device 100, the tip 20Bt of the conductive region 20B is surrounded by the insulating layer 101. Therefore, carrier diffusion from the conductive region 20B is suppressed by the insulating layer 101.

However, to form the insulating layer 101, a CMP process that grinds the front surface side of the insulating layer 101 is needed. Hence, in the actual process, the thickness of the insulating layer 101 may be decreased differentially due to the dishing effect of the CMP. Such a state reduces the insulating properties of the insulating layer 101.

Since the insulating properties of the insulating layer 101 are reduced, in the semiconductor device 100 it is necessary that an element, an interconnection, etc. be placed distant from the insulating layer 101. Thus, an increase in the size of the semiconductor device is caused in the reference example.

In contrast, in the semiconductor device 1, the insulating layer 101 is not needed. Thereby, there is no need to consider the dishing effect of the insulating layer 101. Thus, it is not necessary to dispose an element, an interconnection, etc. distant from the insulating layer 101. Thus, the size of the semiconductor device can be made smaller.

Second Embodiment

Figure 7A:
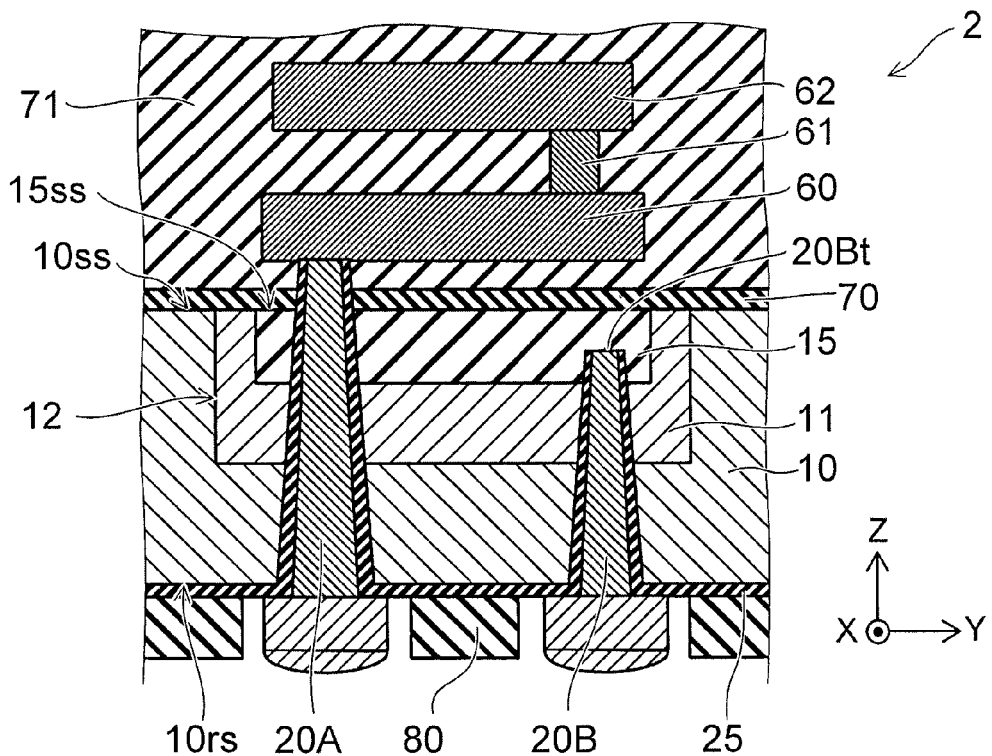
FIG. 7A and FIG. 7B are schematic cross-sectional views showing a semiconductor device according to a second embodiment.
Figure 7B:
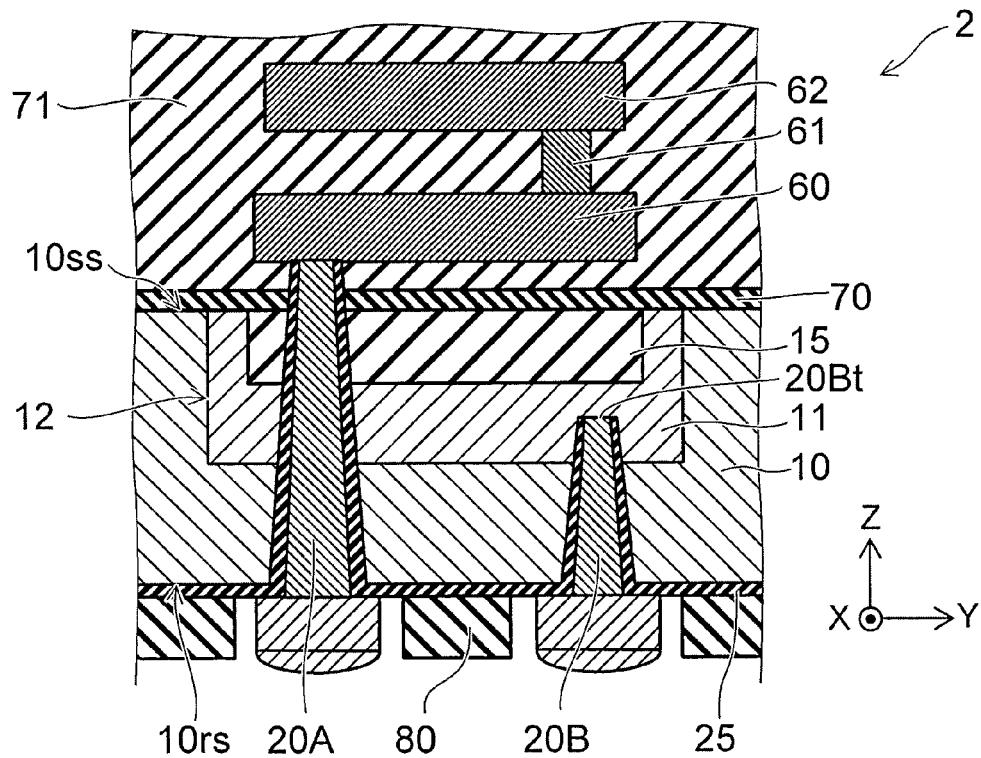

FIG. 7A and FIG. 7B are schematic cross-sectional views showing a semiconductor device according to a second embodiment.

FIG. 7A and FIG. 7B show a cross section corresponding to the position of line A-A' of FIG. 1A.

The basic structure of a semiconductor device 2 according to the second embodiment is the same as the basic structure of the semiconductor device 1 according to the first embodiment. The semiconductor device 2 further includes an insulating region 15. The insulating region 15 surrounds part (for example, an upper portion) of the conductive region 20A via the insulating film 25 on the front surface 10ss side of the semiconductor layer 10. In the insulating region 15, portions other than the front surface 15ss of the insulating region 15 (for example, a lower portion and a side portion of the insulating region 15) are surrounded by the semiconductor region 11.

FIG. 7A shows a state where the conductive region 20B is in contact with the insulating region 15. FIG. 7B shows a state where the conductive region 20B is not in contact with the insulating region 15.

In the semiconductor device 2, in the case where the conductive region 20B is in contact with the insulating region 15 (FIG. 7A), the tip 20Bt of the conductive region 20B is surrounded by the insulating region 15. Therefore, carrier diffusion from the conductive region 20B is suppressed by the insulating region 15.

On the other hand, in the case where the conductive region 20B is not in contact with the insulating region 15 (FIG. 7B), the tip 20Bt of the conductive region 20B is surrounded by the semiconductor region 11. In this case, carrier diffusion from the conductive region 20B to the semiconductor layer 10 is suppressed by the same operation as the semiconductor device 1 due to the existence of the pn junction 12.

Thus, the semiconductor device 2 has a structure in which a current leak is less likely to occur between the conductive region 20B and the semiconductor layer 10. Thus, in the semiconductor device 2, there is no operational malfunction, and a faulty operation and a yield reduction are less likely to occur.

Furthermore, in the semiconductor device 2, since the insulating region 15 is provided under the insulating film 70, the breakdown voltage between the electrode 60, and the semiconductor layer 10 and the semiconductor region 11 is further increased.

Third Embodiment

Figure 8A:
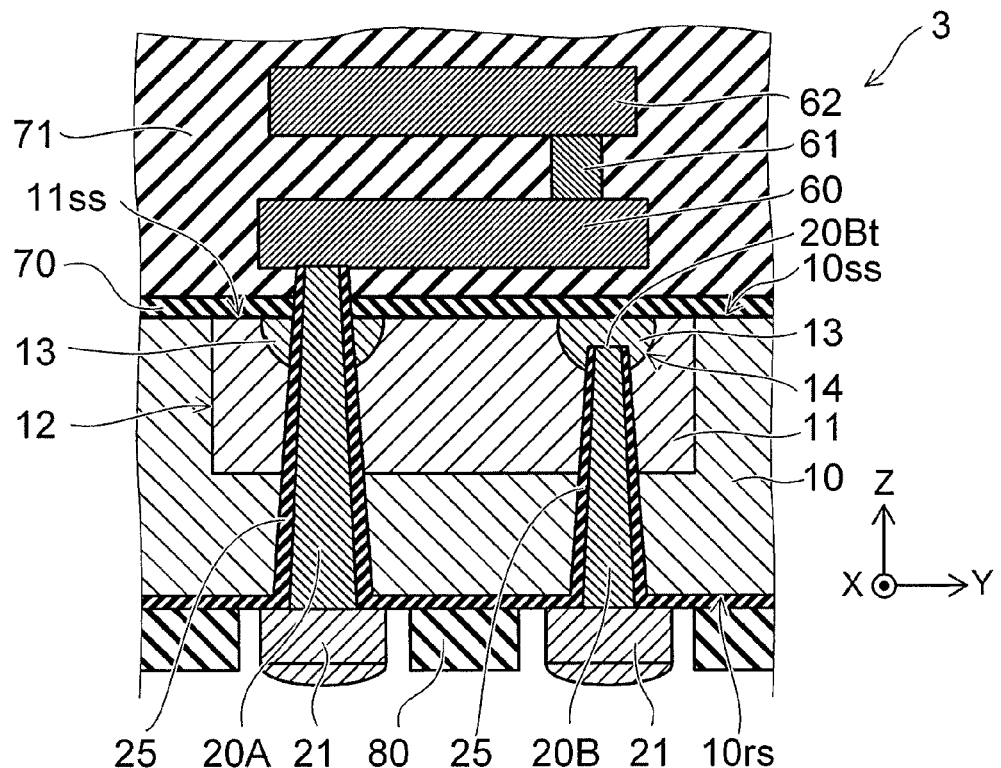
FIG. 8A is a schematic cross-sectional view showing a semiconductor device according to a third embodiment.
Figure 8B:
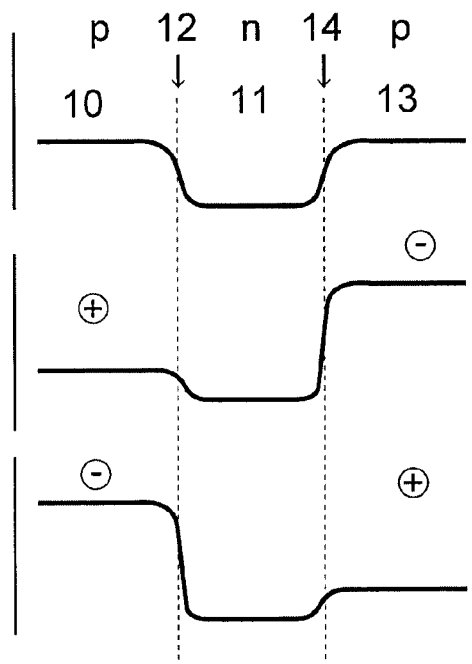
FIG. 8B is a diagram showing band structures of the semiconductor layer of the semiconductor device according to the third embodiment.

FIG. 8A is a schematic cross-sectional view showing a semiconductor device according to a third embodiment, and FIG. 8B is a diagram showing band structures of the semiconductor layer of the semiconductor device according to the third embodiment.

FIG. 8A shows a cross section corresponding to the position of line A-A' of FIG. 1A.

The basic structure of a semiconductor device 3 according to the third embodiment is the same as the basic structure of the semiconductor device 1 according to the first embodiment. The semiconductor device 3 further includes a plurality of semiconductor regions 13 of a first conductivity type (a second semiconductor region). The plurality of semiconductor regions 13 are provided between the insulating film 70 and the semiconductor region 11. One of the semiconductor regions 13 is provided between the conductive region 20B and the semiconductor region 11. The conductive region 20A pierces the semiconductor region 13 and is in contact with the electrode 60. The semiconductor region 13 surrounds a part of the conductive region 20A.

In the case where the conductive region 20B contains copper (Cu), copper may diffuse from the tip 20Bt of the conductive region 20B, for example. In this case, a p-type semiconductor region 13 is formed between the conductive region 20B and the semiconductor region 11. The embodiment includes a configuration in which the p-type semiconductor region 13 is provided between the conductive region 20B and the semiconductor region 11. In the semiconductor device 3, the pn junction 12 and a pn junction 14 are formed.

The upper portion of FIG. 8B shows a band structure of a state where no bias from the outside is applied between the semiconductor layer 10, the semiconductor region 11, and the semiconductor region 13. In this case, a barrier based on the diffusion potential is formed in each of the pn junctions 12 and 14.

The middle portion of FIG. 8B shows a band structure of a state where a positive potential is applied to the semiconductor layer 10 and a negative potential is applied to the conductive region 20B. A negative potential is applied to the semiconductor region 13 connected to the conductive region 20B. In this case, the pn junction 12 becomes forward bias. However, the pn junction 14 becomes reverse bias. Thereby, the energy barrier in the pn junction 14 becomes larger, and carrier diffusion from the conductive region 20B to the semiconductor layer 10 is suppressed.

The lower portion of FIG. 8B shows a band structure of a state where a negative potential is applied to the semiconductor layer 10 and a positive potential is applied to the conductive region 20B. A positive potential is applied to the semiconductor region 13 connected to the conductive region 20B. In this case, the pn junction 14 becomes forward bias. However, the pn junction 12 becomes reverse bias. Thereby, the energy barrier in the pn junction 12 becomes larger, and carrier diffusion from the conductive region 20B to the semiconductor layer 10 is suppressed.

Thus, the semiconductor device 3 has a structure in which a current leak is less likely to occur both in the case where a positive potential is applied to the conductive region 20B and a negative potential is applied to the semiconductor layer 10 and in the case where a negative potential is applied to the conductive region 20B and a positive potential is applied to the semiconductor layer 10. Thus, in the semiconductor device 3, there is no operational malfunction, and a faulty operation and a yield reduction are less likely to occur. Also, a structure in which FIG. 7B and FIG. 8B are combined is included in the embodiment.

Fourth Embodiment

Figure 9:
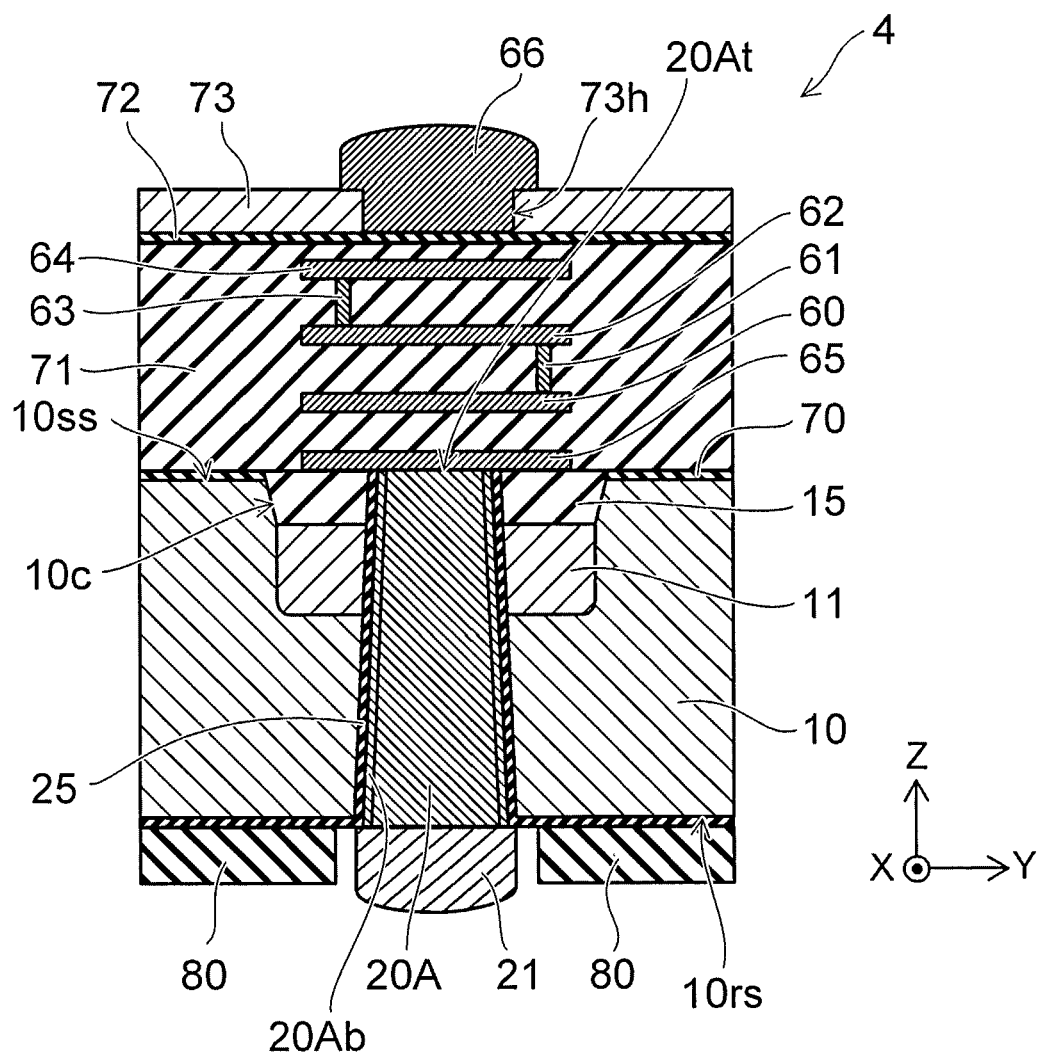
FIG. 9 is a schematic cross-sectional view showing a semiconductor device according to a fourth embodiment.

FIG. 9 is a schematic cross-sectional view showing a semiconductor device according to a fourth embodiment.

A semiconductor device 4 according to the fourth embodiment includes the semiconductor layer 10, an electrode 65 (first electrode), the insulating region 15, the semiconductor region 11, the conductive region 20A, the insulating film 25, and the electrode 21 (second electrode). FIG. 9 shows one conductive region 20A as an example. The semiconductor device 4 may include other conductive region (for example, one of the conductive regions 20B to 20D) other than the conductive region 20A.

The electrode 65 is provided on a side of the front surface 10ss of the semiconductor layer 10. The electrode 65 is provided on the semiconductor layer 10. The electrode 65 is electrically connected to the above elements, interconnections or the like. The electrode 65 is used, for example, for the gate interconnection of an n-channel type FET (MOSFET (Metal Oxide Semiconductor Field Effect Transistor), IGBT (Insulated Gate Bipolar Transistor)) or the like. FET may be CMOS (Complementary Metal Oxide Semiconductor). When the electrode 65 is used as the gate interconnection, a potential of −20 V to +20 V may be applied to the electrode 65, for example.

A recess 10c is provided on a side of the front surface 10ss of the semiconductor layer 10. The insulating region 15 is provided in the recess 10c. The insulating region 15 is provided between the semiconductor layer 10 and the electrode 65. Viewed in the Z-direction, the insulating region 15 surrounds a part of the conductive region 20A via the insulating film 25.

The semiconductor region 11 is provided on the insulating region 15 on a side of the back surface 10rs. In the direction (Z-direction) from the semiconductor layer 10 toward the electrode 65, the semiconductor region 11 is provided between the semiconductor layer 10 and the insulating region 15. The semiconductor region 11 is in contact with the insulating region 15. The semiconductor region 11 is in contact with the semiconductor layer 10. No space is provided between the semiconductor region 11 and the insulating region 15. Viewed in the Z-direction, the semiconductor region 11 surrounds a part of the conductive region 20A via the insulating film 25.

The conductive region 20A extends in the Z-direction in the semiconductor layer 10, in the semiconductor region 11, and in the insulating region 15. A tip 20At of the conductive region 20A is connected to the electrode 65. The insulating film 25 is provided between the conductive region 20A and the semiconductor layer 10 and between the conductive region 20A and the semiconductor region 11. Thereby, insulating property between the conductive region 20A and the semiconductor layer 10 and insulating property between the conductive region 20A and the semiconductor region 11 are maintained. A barrier film 20Ab such as Ti (titanium), titanium nitride (TiN) or the like is provided between the insulating film 25 and the conductive region 20A. In the embodiment, the barrier film 20Ab may be included in the conductive region 20A and may be the conductive region 20A.

The electrode 21 is provided on a side of the back surface 10rs of the semiconductor layer 10. The electrode 21 is connected to the conductive region 20A. The electrode 21, for example, protrudes downward from, the insulating layer 80. The electrode 60, the electrode 62, and an electrode 64 are provided on the electrode 65. Each of the electrode 60, the electrode 62, and the electrode 64 is provided in the interlayer insulating film 71. The insulating film 70 may be provided between the interlayer insulating film 71 and the semiconductor layer 10. In the embodiment, one of the electrode 60, the electrode 62 and the electrode 64 is a third electrode, for example.

The electrode 62 is provided on the electrode 60. The electrode 62 is electrically connected to the electrode 60 via the contact 61. The electrode 62 may be insulated from the electrode 60 without providing the contact 61. The electrode 64 is provided above the electrode 62. The electrode 64 is electrically connected to the electrode 62 via a contact 63. The electrode 62 may be insulated from the electrode 60 without providing the contact 63. The electrode 64 is provided above the electrode 62. The electrode 64 is electrically connected to the electrode 62 via the contact 63. The electrode 64 may be insulated from the electrode 62 without providing the contact 63. The electrode 65 may be electrically connected to the electrode 60 via a contact (not shown), for example.

An insulating film 72 is provided on the interlayer insulting film 71. A protection layer 73 is provided on the insulating film 72. An opening 73h is provided in the protection layer 73. An electrode 66 is provided in the opening 73h. The electrode 66 protrudes upward from the protection layer 73.

FIG. 10A to FIG. 11B are schematic cross-sectional views showing a manufacturing process of the semiconductor device according to the fourth embodiment.

Figure 10A:
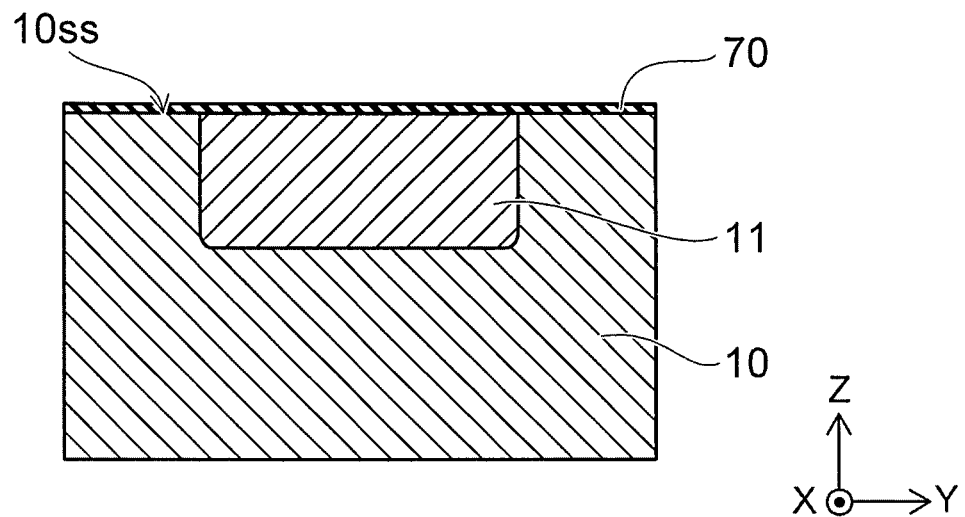
FIG. 10A to FIG. 11B are schematic cross-sectional views showing a manufacturing process of the semiconductor device according to the fourth embodiment.

For example, as shown in FIG. 10A, the n-type semiconductor region 11 is selectively formed on a side of the front surface 10ss of the p-type semiconductor layer 10. For example, an n-type impurity element is selectively implanted into the front surface 10ss of the semiconductor layer 10, after that heat treatment is performed. Thereby, the semiconductor region 11 is formed on a side of the front surface 10ss of the semiconductor layer 10. The n-type impurity element is, for example, phosphorous (P), arsenic (As) or the like. The insulating film 70 is formed on the semiconductor region 11 and the semiconductor layer 10.

Figure 10B:
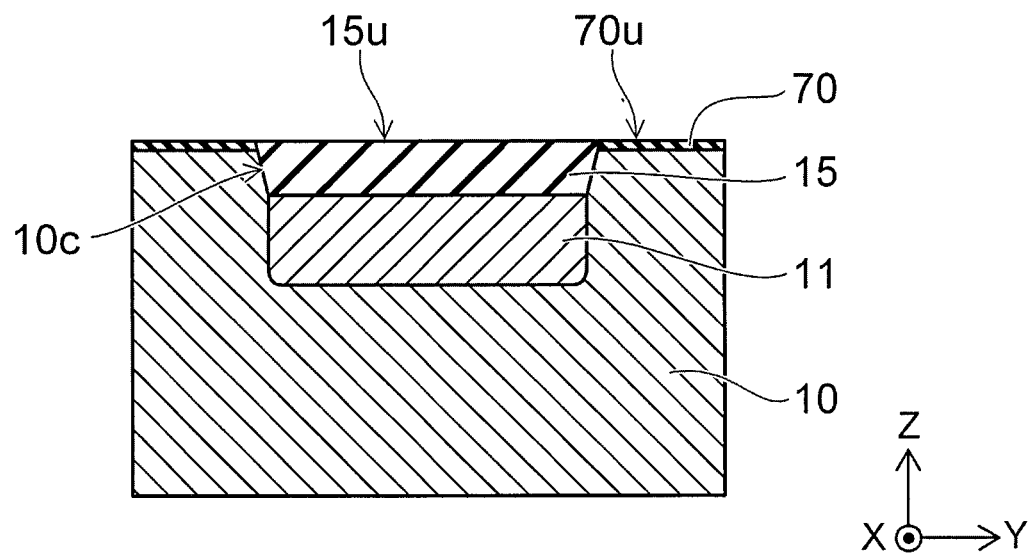

Next, as shown in FIG. 10B, the recess 10c is formed on a side of the front surface 10ss of the semiconductor layer 10 by photolithography and RIE (Reactive Ion Etching). After that, the insulting region 15 is formed in the recess 10c. Thereby, the insulating region 15 is formed on the semiconductor region 11. CMP treatment is performed on a surface 15u of the insulating region 15 and a surface 70u of the insulating film 70 as necessary.

Figure 11A:
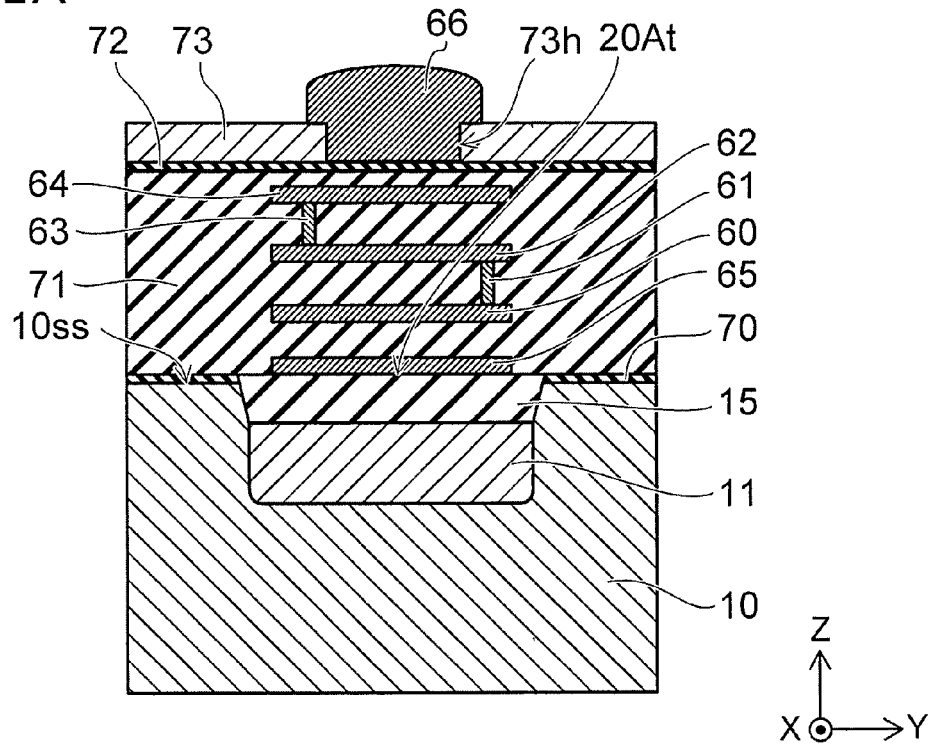

Next, as shown in FIG. 11A, the interlayer insulating film 71, the electrode 60, the electrode 62, the electrode 64, the contact 61, the contact 63, the insulating film 72, the protection layer 73 and the electrode 66 are formed on the insulating region 15 and the insulating film 70.

Figure 11B:
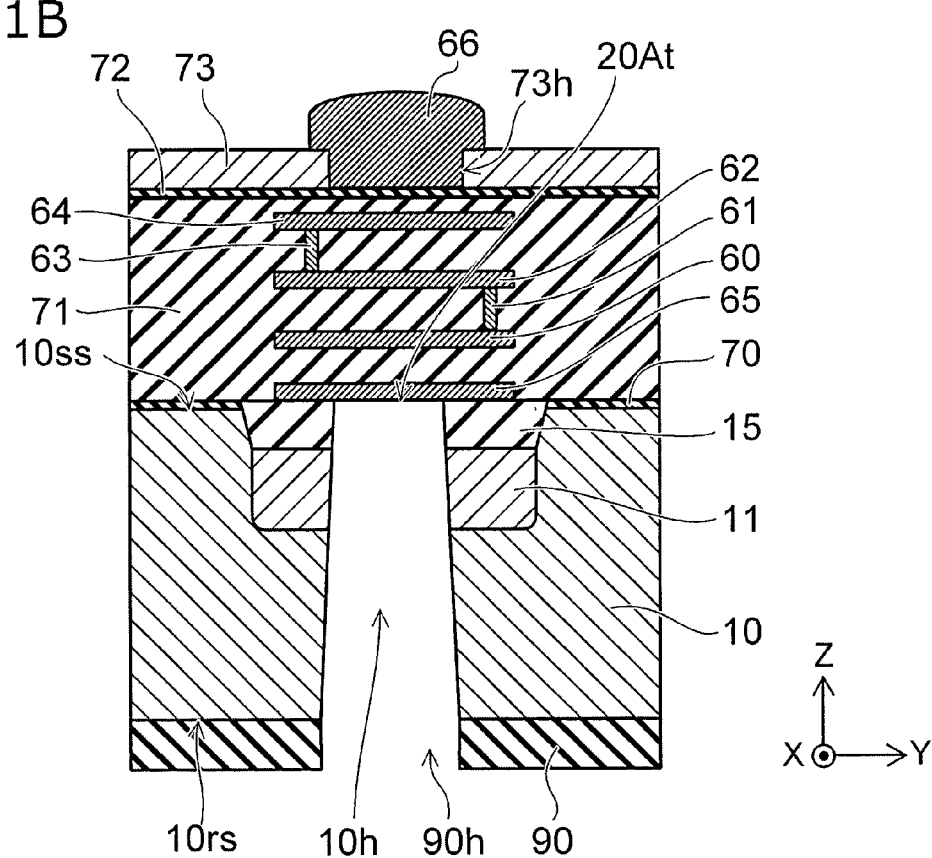

Next, as shown in FIG. 11B, a mask layer 90 is formed on a side of the back surface 10rs of the semiconductor layer 10 by photolithography and RIE. Furthermore, the semiconductor layer 10 exposed from the mask layer 90 is etched by RIE. For example, after the semiconductor layer 10 is etched by an etching gas, the etching gas is switched to another etching gas, the insulating region 15 is etched furthermore. Thereby, a via hole 10h reaching from the back surface 10rs to the electrode 60 is formed on the semiconductor layer 10. The via hole 10h pierces the semiconductor region 11 and the insulating region 15.

In the case where etching is stopped in the insulating region 15 when forming the via hole 10h, the tip 20At of the conductive region 20A results in being surrounded by the insulating region 15. Thereby, insulating property between the conductive region 20A and the semiconductor layer 10 and insulating property between the conductive region 20A and the semiconductor layer 10 are maintained. After forming the via hole 10h, the mask layer 90 is removed.

After that, as shown in FIG. 9, the insulating film 25 is formed in the via hole 10h and on the back surface 10rs of the semiconductor layer 10. The barrier film 20Ab and the conductive region 20A are formed in the via hole 10h via the insulating film 25. Furthermore, the electrode 21 connected to the conductive region 20A is formed.

FIG. 12A to FIG. 12C are schematic views showing one example of effects of the semiconductor device according to the fourth embodiment.

As shown in FIG. 12A, in the process in which the via hole 10h is formed in the semiconductor layer 10 and the semiconductor region 11, a notching phenomenon in dry etching process may occur. For example, in the case where the via hole 10h is formed from the back surface 10rs of the semiconductor layer 10, silicon is etched till the via hole 10h reaches the insulating region 15, and after reaching the insulating region 15, the oxide film comes to be etched.

Here, after the via hole 10h reaches the insulating region 15, the insulating region 15 may be charged by ions included in the etching gas. In such a case, traveling direction of ions arriving at near the insulating region 15 is bent, so that a preferential direction of progress of etching may be not a vertical direction but a lateral direction (notching direction). Thereby, a depression 16 may be formed between the insulating region 15 and the semiconductor region 11. The depression 16 communicates with the via hole 10h.

Next, as shown in FIG. 12B, the etching is continued until the via hole 10h reaches the electrode 60. However, the once formed depression 16 is left. Alternately, the depression 16 is exposed to the etching gas, so that the capacity may become larger.

Next, as shown in FIG. 12C, the insulating film 25 is formed in the via hole 10h. However, an aspect ratio of the semiconductor layer 10 and the via hole 10h piercing the insulating region 15 is relatively high. Therefore, in the proximity of the insulating region 15 in the via hole 10h, a step coverage of the insulating film 25 may become worse. That is, the insulating film 25 with a sufficient thickness may not be formed in the depression 16.

In such a condition, the barrier film 20Ab and the conductive region 20A are formed in the via hole 10h, then the barrier film 20Ab or the conductive region 20A contacts the semiconductor region 11 without via the insulating film 25 (FIG. 12C). That is, a part of the conductive region 20A and a part of the semiconductor region 11 are electrically connected. Therefore, for example, in the case where a positive potential is applied to the conductive region 20A, the positive potential is conducted to the semiconductor region 11.

However, a conductivity type of the semiconductor layer 10 is a p-type, and a conductivity type of the semiconductor region 11 is an n-type. That is, in the semiconductor device 4, a parasitic pn diode formed of the p-type semiconductor layer 10 and the n-type semiconductor region 11 is formed. The semiconductor layer 10 is set at a ground potential (or a negative potential). Therefore, in the case where the positive potential is applied to the conductive region 20A, a reverse bias is applied to a junction between the p-type semiconductor layer 10 and the n-type semiconductor region 11.

In the case where the reverse bias is applied to the junction between the p-type semiconductor layer 10 and the n-type semiconductor region 11, the pn junction 12 serves as an energy barrier for holes existing in the p-type semiconductor layer and electrons existing in the n-type semiconductor region 11. Thereby, a current is not likely to flow between the p-type semiconductor layer 10 and the n-type semiconductor region 11. That is, even if a part of the conductive region 20A is electrically connected to a part of the semiconductor region 11, the current is not likely to flow between the conductive region 20A and the semiconductor layer 10. Thereby, even if the part of the conductive region 20A is electrically connected to the part of the semiconductor region 11, an electrical short-circuit is prevented between the conductive region 20A and the semiconductor layer 10.

In the semiconductor device 4, multilayers of the electrode 60, 62, 64 are included on the electrode 60. For example, in the case where the via hole 10h is in a plurality and respective widths are different, when the plurality of via holes 10h are formed under the same etching condition, depths of the respective via holes 10h may be different. By providing the multilayers of the electrode 60, 62, 64 on the electrode 61, progress of etching of the respective via holes 10h can be stopped at one of the electrodes 65, 60, 62, 64.

Fifth Embodiment

Figure 13A:
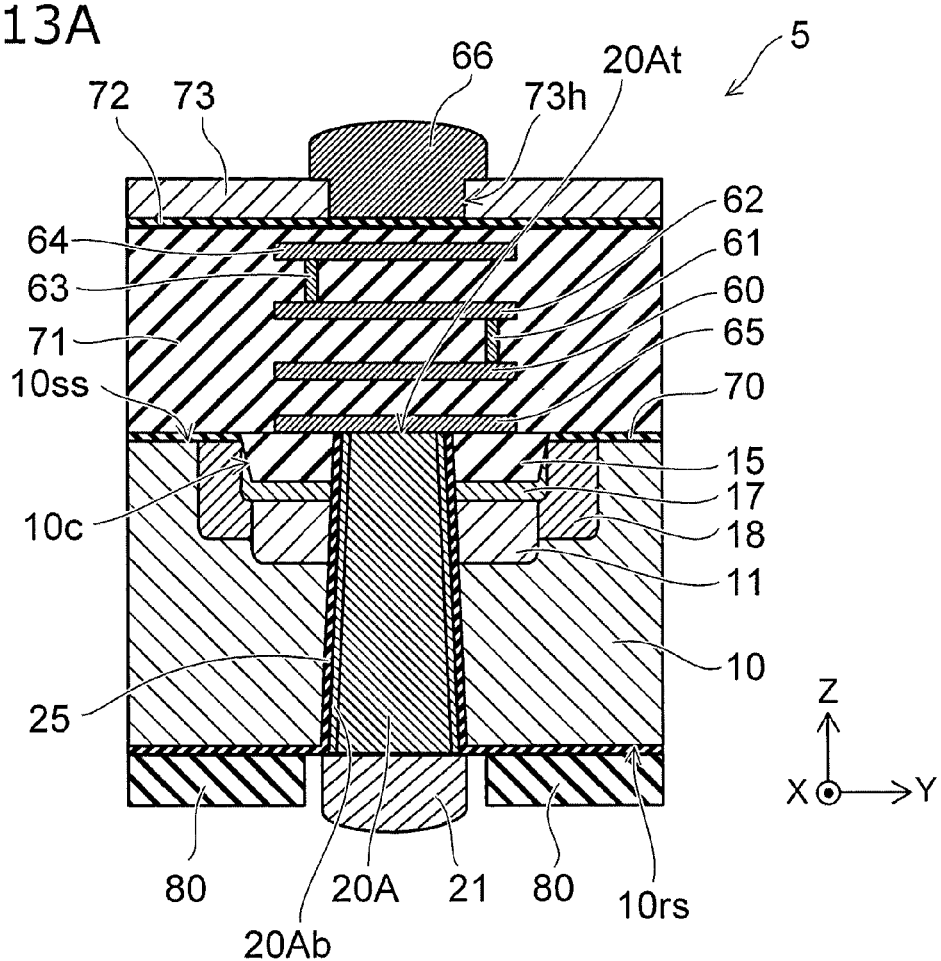
FIG. 13A is a schematic cross-sectional view showing a semiconductor device according to a fifth embodiment.
Figure 13B:
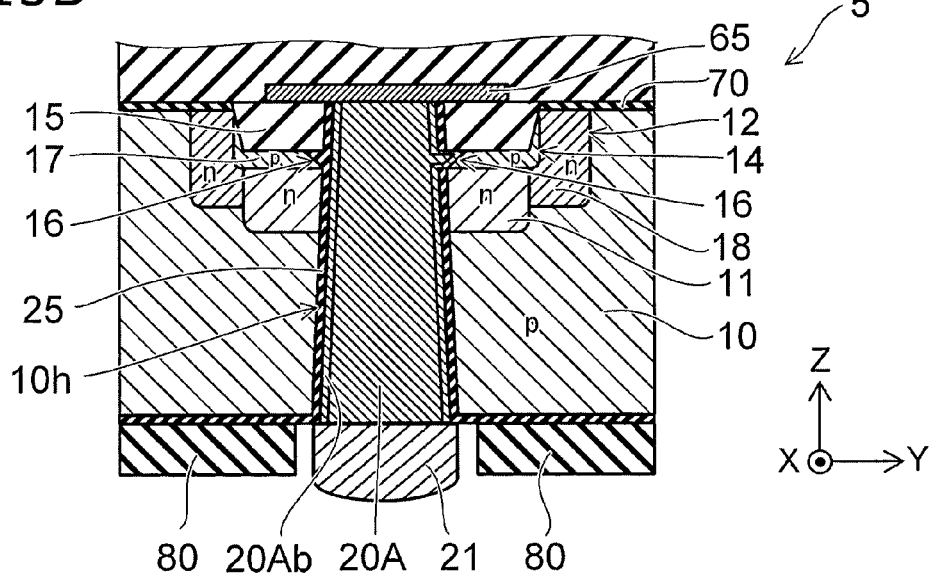
FIG. 13B is a schematic cross-sectional view showing effects of the semiconductor device according to the fifth embodiment.

FIG. 13A is a schematic cross-sectional view showing a semiconductor device according to a fifth embodiment. FIG. 13B is a schematic cross-sectional view showing effects of the semiconductor device according to the fifth embodiment.

The semiconductor device 5 shown in FIG. 13A includes a p-type semiconductor region 17 and an n-type semiconductor region 18 other than the constitution included in the semiconductor device 4. The semiconductor region 17 is formed by implanting a p-type impurity element into the semiconductor layer 10. The semiconductor region 18 is formed by implanting an n-type impurity element into the semiconductor layer 10. The semiconductor region 17 is provided between the insulating region 15 and the semiconductor region 11.

Viewed in the Z-direction, the insulating region 15 is surrounded by the semiconductor region 11. Viewed in the Z-direction, the semiconductor region 17 is surrounded by the semiconductor region 18. The semiconductor region 17 is in contact with the semiconductor region 11 and the semiconductor region 18. The semiconductor region 18 and the semiconductor region 11 may be referred to be as the first semiconductor region of the second conductivity type. The semiconductor region 17 may be referred to be as the second semiconductor region of the first conductivity type. The semiconductor region 17 may be referred to as the well region 17. The semiconductor region 18 may be referred to as the well region 18.

For example, as shown in FIG. 13B, in the case where the depression 16 is formed between the insulating region 15 and the semiconductor region 17, the part of the conductive region 20A may be electrically connected to the part of the semiconductor region 17. In such a case, the conductive region 20A is electrically connected to the semiconductor region 17.

Here, in the case where the positive potential is applied to the conductive region 20A, and the ground potential (or negative potential) is applied to the semiconductor layer 10, the reverse bias is applied to the junction between the p-type semiconductor layer 10 and the n-type semiconductor region 11, and the reverse bias is also applied to a junction between the p-type semiconductor layer 10 and the n-type semiconductor region 18.

In the case where the reverse bias is applied, the pn junction 12 serves as an energy barrier for holes existing in the p-type semiconductor layer 10 and electrons existing in the n-type semiconductor regions 11, 18. Thereby, a current is not likely to flow between the p-type semiconductor layer 10 and the n-type semiconductor region 11, and between the p-type semiconductor layer 10 and the n-type semiconductor region 18. Thereby, a short-circuit can be prevented between the conductive region 20A and the semiconductor layer 10.

Furthermore, in the case where the negative potential is applied to the conductive region 20A, and the ground potential (or positive potential) is applied to the semiconductor layer 10, the forward bias is applied to the junction between the p-type semiconductor layer 10 and the n-type semiconductor region 11, and the forward bias is also applied to the junction between the p-type semiconductor layer 10 and the n-type semiconductor region 18.

However, in the case where the negative potential is applied to the conductive region 20A, and the ground potential (or positive potential) is applied to the semiconductor layer 10, the reverse bias is applied to a junction between the p-type semiconductor layer 17 and the n-type semiconductor region 11, and the reverse bias is also applied to a junction between the p-type semiconductor layer 17 and the n-type semiconductor region 18.

In the case where the reverse bias is applied, the pn junction 14 serves as an energy barrier for holes existing in the p-type semiconductor region 17 and electrons existing in the n-type semiconductor regions 17, 18. Thereby, a current is not likely to flow between the p-type semiconductor region 17 and the n-type semiconductor region 11, and between the p-type semiconductor region 17 and the n-type semiconductor region 18. Thereby, a short-circuit can be prevented between the conductive region 20A and the semiconductor layer 10.

Thus, in the semiconductor device 5, in the case where the conductive region 20A is in contact with the semiconductor region 17, and a positive potential is applied to the conductive region 20A, a short-circuit between the conductive region 20A and the semiconductor layer 10 can be prevented.

Sixth Embodiment

Figure 14:
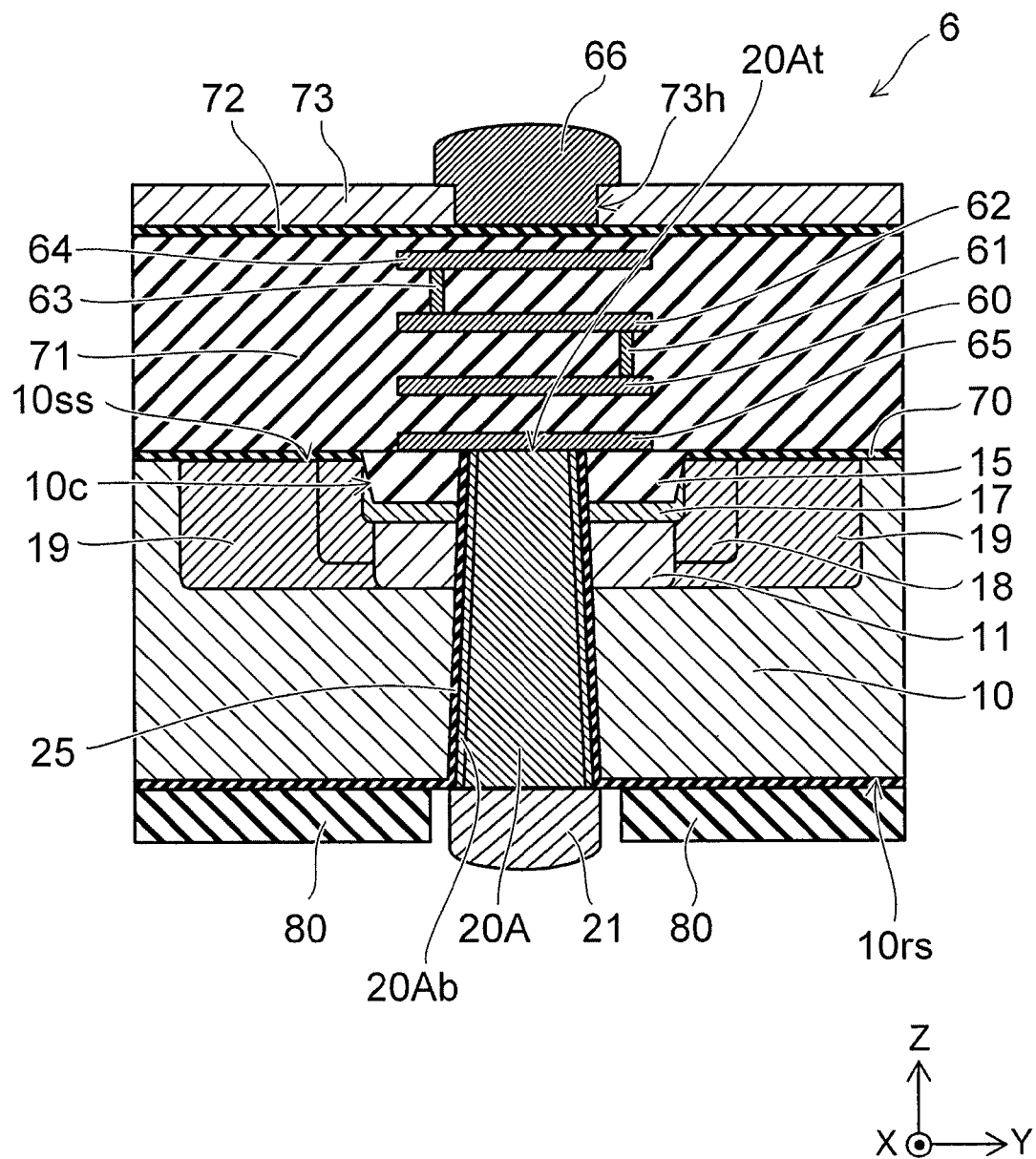
FIG. 14 is a schematic cross-sectional view showing a semiconductor device according to a sixth embodiment.

FIG. 14 is a schematic view showing a semiconductor device according to the sixth embodiment.

A semiconductor device 6 shown in FIG. 14 includes a p-type semiconductor region 19 (third semiconductor region) other than the constitution included in the semiconductor device 5. The semiconductor region 19 may be referred to as the well region 19. The semiconductor region 19 is formed by implanting p-type impurity elements into the surface the semiconductor layer 10. The semiconductor layer 19 is provided on a side of the front surface 10ss of the semiconductor layer 10. Viewed in the Z-direction, the semiconductor region 19 surrounds the semiconductor regions 11, 17, 18. The semiconductor region 19 is in contact with the semiconductor region 18.

The pn junction is produced between the semiconductor region 19 and the semiconductor regions 17, 18 by contacting the p-type semiconductor region 19 to the semiconductor regions 17, 18. The pn junction serves as an energy barrier for carriers, and an electrical short-circuit is further suppressed between the conductive region 20A and the semiconductor layer 10.

A resistance around the conductive region 20A is more decreased by providing the semiconductor region 19 containing an impurity element in the semiconductor layer 10. Thereby, in the case where the positive potential or the negative potential is applied to the conductive region 20A, potential increase (or voltage drop) around the conductive region 20A is suppressed. For example, when the potential around the conductive region 20A increases, a voltage is produced between around the conductive region 20A and outside the conductive region 20A. Thereby, an unnecessary current caused by this voltage may flow in the semiconductor layer 10. In the semiconductor device 6, the potential increase (or voltage drop) around the conductive region 20A is suppressed, and this unnecessary current is suppressed.

As one example, the case is assumed where a parasitic transistor of an npn structure or a pnp structure is provided in the semiconductor device. In such a case, when a current flows into a specified n-layer or p-layer in the npn structure or the pnp structure, and these potential increase (or decrease) specifically, so that latch up occurs in the semiconductor device, and on/off operation of the current becomes difficult to be controlled in the semiconductor device. In the semiconductor device 6, by providing the semiconductor region 19 containing an impurity element in the semiconductor layer 10, the resistance around the conductive region 20A decreases more. Thereby, the potential increase around the conductive region 20A is suppressed and the latch up is suppressed.

Seventh Embodiment

Figure 15:
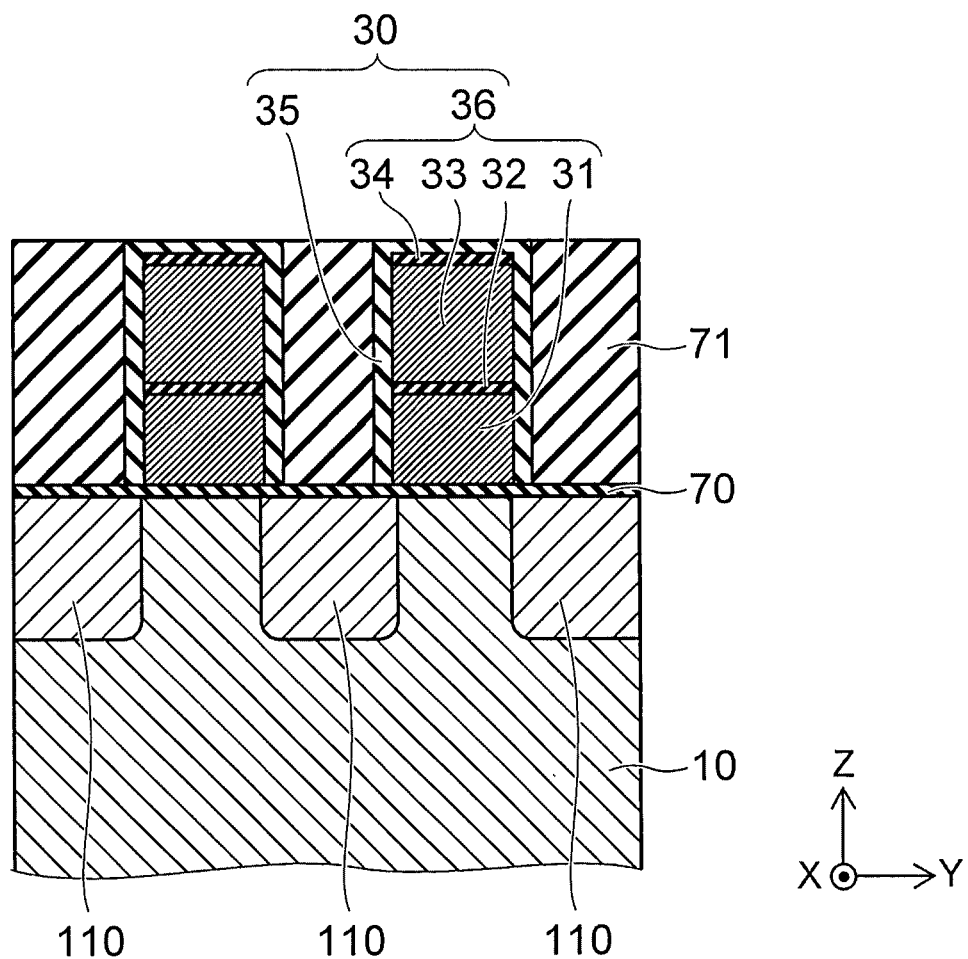
FIG. 15 is a schematic cross-sectional view showing a semiconductor device according to a seventh embodiment.

FIG. 15 is a schematic cross-sectional view showing a semiconductor device according to a seventh embodiment.

In the semiconductor devices 1 to 6 described above, for example, a memory region 30 may be further provided. FIG. 15 shows a selected memory cell 36 (NAND type flash memory cell) included in the memory cell region 30. The number of the memory cell 36 is not limited to the number shown, for example, a plurality of memory cells 36 are arranged in series in the Y-direction. On both sides of the plurality of memory cells 36 arranged in series, for example, selection transistors are provided (not shown). The memory cells 36 include, for example, a floating electrode 31, an insulating film 32, a gate electrode 33, and a protection film 34.

In the memory region 30, semiconductor regions 110 are provided on a surface layer of the semiconductor layer 10 between the adjacent memory cells 36. For example, the semiconductor regions 110 are n-type semiconductor regions. An impurity concentration contained in the semiconductor regions 110 may be the same as an impurity concentration contained in the semiconductor region 11 described above. The semiconductor layer 10 between the adjacent semiconductor regions 110 serves as an active region in the memory region 30.

The insulating film 70 is provided on the semiconductor layer 10 and the semiconductor regions 110. In the memory cells 36, the floating electrode 31 is an electrode being possible to store charges. The floating electrode 31 is provided on the semiconductor layer 10 via the insulating film 70. The insulating film 32 is provided on the floating electrode 31. The gate electrode 33 is a word line of the memory region 30. The gate electrode 33 is provided on the insulating film 32. The protection film 34 is provided on the gate electrode 33. The memory cells 36 are surrounded by the protection film 35.

In the semiconductor devices 1 to 6 having the memory region 30, the forming the semiconductor regions 110 and the forming the semiconductor region 11 may be performed simultaneously. Thus, manufacturing cost is not likely to rise, compared the case that the forming the semiconductor regions 110 and the forming the semiconductor region 11 are not performed simultaneously.

In the embodiment, the p type is taken as the first conductivity type and the n type is taken as the second conductivity type. Also structures in which the p type and the n type are exchanged to take the n type as the first conductivity type and the p type as the second conductivity type are included in the embodiment.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

The term "on" in "a portion A is provided on a portion B" refers to the case where the portion A is provided on the portion B such that the portion A is in contact with the portion B and the case where the portion A is provided above the portion B such that the portion A is not in contact with the portion B.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
a first electrode;
a second electrode separated from the first electrode in a first direction;
a third electrode separated from and arranged with the second electrode in a second direction crossing the first direction;
a semiconductor substrate of a first conductivity type, at least a part of the semiconductor substrate being provided between the first electrode and the second electrode, and between the first electrode and the third electrode;
a first semiconductor region of a second conductivity type, the first semiconductor region being provided between the at least the part of the semiconductor substrate and the first electrode in the first direction, the first semiconductor region being provided between other parts of the semiconductor substrate in a direction crossing the first direction;
a first conductive region extending in the semiconductor substrate and the semiconductor region along the first direction, and being connected with the first electrode and the second electrode;
a second conductive region extending in the semiconductor substrate along the first direction, and extending in a part of the first semiconductor region along the first direction, and being connected with the third electrode; and
an insulating film provided between the first conductive region and the semiconductor substrate, and provided between the first conductive region and the first semiconductor region, and between the second conductive region and the semiconductor substrate.

2. The device according to claim 1, wherein a pn junction is formed by junction of the semiconductor substrate and the first semiconductor region.

3. The device according to claim 2, wherein an electric potential applied to the first and second conductive regions is a positive potential and an electric potential applied to the semiconductor substrate is a ground potential or a negative potential.

4. The device according to claim 1, further comprising an insulating region provided between at least a part of the first semiconductor region and the first electrode, the first conductive region further extending in the insulating region along the first direction.

5. The device according to claim 4, wherein a part of the first semiconductor region is provided between the insulating region and the second conductive region in the first direction.

6. The device according to claim 4, wherein the second semiconductor region reaches the insulating region.

7. The device according to claim 2, further comprising a second semiconductor region of a first conductivity type, at least a part of the second semiconductor region being provided between the second conductive region and the first semiconductor region.

8. The device according to claim 1, further comprising a second semiconductor region of a first conductivity type, the second semiconductor region being provided between the first semiconductor region and the first conductive region.

9. The device according to claim 7, wherein the second conductive region is provided between at least a part of the second semiconductor region and the third electrode.

10. The device according to claim 7, wherein
a pn junction is formed by junction of the second semiconductor region and the first semiconductor region.

11. A semiconductor device comprising:
a first electrode;
a second electrode separated from the first electrode in a first direction;
a semiconductor substrate of a first conductivity type, at least a part of the semiconductor substrate being provided between the first electrode and the second electrode;
a first semiconductor region of a second conductivity type, the first semiconductor region being provided between the first electrode and the at least part of the semiconductor substrate in the first direction;
an insulating region provided between the first electrode and the first semiconductor region in the first direction;
a conductive region extending in the semiconductor substrate and the first semiconductor region and the insulating region along the first direction, the conductive region being connected with the first electrode and the second electrode; and
an insulating film provided between the conductive region and the semiconductor substrate, and between the conductive region and the first semiconductor region.

12. The device according to claim 11, wherein
the insulating region is surrounded by the first semiconductor region.

13. The device according to claim 11, further comprising:
a second semiconductor region of a first conductivity type, the second semiconductor region being provided between the insulating region and the first semiconductor region.

14. The device according to claim 13, wherein
the second semiconductor region is surrounded by the first semiconductor region.

15. The device according to claim 11, further comprising:
a third semiconductor region of a first conductivity type, the third semiconductor region surrounding the first semiconductor region.

16. The device according to claim 11, wherein
the conductive region is electrically connected to the first semiconductor region.

17. The device according to claim 13, wherein
the conductive region is electrically connected to the second semiconductor region.

18. The device according to claim 11, further comprising:
a third electrode, at least a part of the first electrode being provided between the third electrode and the semiconductor substrate.

19. The device according to claim 1, wherein the second conductive region stops partway through the first semiconductor region.

* * * * *